(12) United States Patent
Hagenbuch

(10) Patent No.: US 9,489,483 B2
(45) Date of Patent: Nov. 8, 2016

(54) METHOD OF ESTIMATING THE VOLUMETRIC CARRYING CAPACITY OF A TRUCK BODY

(71) Applicant: LeRoy G. Hagenbuch, Peoria Heights, IL (US)

(72) Inventor: LeRoy G. Hagenbuch, Peoria Heights, IL (US)

(*) Notice: Subject to any disclaimer, the term of this patent is extended or adjusted under 35 U.S.C. 154(b) by 0 days.

(21) Appl. No.: 13/855,550

(22) Filed: Apr. 2, 2013

(65) Prior Publication Data
US 2013/0226396 A1    Aug. 29, 2013

Related U.S. Application Data

(63) Continuation of application No. 13/628,646, filed on Sep. 27, 2012, now abandoned, which is a continuation of application No. 13/048,452, filed on Mar. 15, 2011, now Pat. No. 8,280,596, which is a continuation of
(Continued)

(51) Int. Cl.
  *B65G 67/04* (2006.01)
  *G06F 17/50* (2006.01)

(52) U.S. Cl.
  CPC ....... *G06F 17/5095* (2013.01); *G06F 17/5009* (2013.01)

(58) Field of Classification Search
  CPC .................. B65G 67/04; G06F 17/50
  USPC ............ 701/50, 124, 1; 414/806, 199; 296/183.1; 702/173
  See application file for complete search history.

(56) References Cited

U.S. PATENT DOCUMENTS

| | | |
|---|---|---|
| 4,190,265 A | 2/1980 | Goodbary et al. |
| 4,614,477 A | 9/1986 | Hagenbuch |
| 4,684,152 A | 8/1987 | Goodbary et al. |
| 4,691,792 A | 9/1987 | Shintani |
| 4,726,616 A | 2/1988 | Schmidt |
| 4,813,004 A | 3/1989 | Fujioka et al. |

(Continued)

FOREIGN PATENT DOCUMENTS

| | | |
|---|---|---|
| WO | 00/76805 A1 | 12/2000 |
| WO | WO 00/76805 A1 | 12/2000 |

OTHER PUBLICATIONS

Society of Automotive Engineers, Inc., SAE Construction, Agricultural and Off-Road Machinery Standards Manuel HS-2800 "Capacity Rating-Dumper Body and Trailer Body," Jan. 1985, p. 380-381.
(Continued)

*Primary Examiner* — Tan Q Nguyen
(74) *Attorney, Agent, or Firm* — Leydig, Voit & Mayer, Ltd.

(57) ABSTRACT

A method for estimating the effective volumetric capacity of a truck body includes establishing a side-to-side profile of a generic load model by extending load side lines upward at a predetermined material angle of repose from the upper edge of the side walls of the truck body and a front-to-rear profile by extending a front load line upward from the upper edge of the front wall and a rear load line upward from at or near a rear edge of the floor at the predetermined material angle of repose. Load plateau lines having predetermined dimensions are established and the height of the plateau lines is determined. A top profile of the generic load is then created and the shape of the load plateau is adjusted into a closed curve shape. A final three-dimensional generic load model is formed and the volume of the load model is calculated.

13 Claims, 16 Drawing Sheets

Related U.S. Application Data application No. 11/838,079, filed on Aug. 13, 2007, now Pat. No. 7,917,266, which is a continuation of application No. 10/286,095, filed on Nov. 1, 2002, now Pat. No. 7,257,467.

(60) Provisional application No. 60/336,064, filed on Nov. 2, 2001.

(56) References Cited

U.S. PATENT DOCUMENTS

| | | |
|---|---|---|
| 5,259,322 A | 11/1993 | Dominguez et al. |
| 5,404,661 A | 4/1995 | Sahm et al. |
| 5,474,363 A | 12/1995 | Hagenbuch |
| 5,531,122 A | 7/1996 | Chatham et al. |
| 5,650,930 A | 7/1997 | Hagenbcuh |
| 5,779,092 A | 7/1998 | Hehn et al. |
| 5,815,960 A | 10/1998 | Soczka |
| 5,844,564 A | 12/1998 | Bennis |
| 5,857,825 A | 1/1999 | Rice |
| 5,887,914 A | 3/1999 | Hagenbuch |
| 5,936,869 A | 8/1999 | Sakaguchi et al. |
| 6,022,068 A | 2/2000 | D'Amico |
| 6,106,072 A | 8/2000 | Lutter, Jr. |
| 6,157,889 A | 12/2000 | Baker |
| 6,313,414 B1 | 11/2001 | Campbell |
| 6,313,474 B1 | 11/2001 | Iwasawa et al. |
| 6,349,252 B1 | 2/2002 | Imanishi et al. |
| 6,374,201 B1 | 4/2002 | Grizon et al. |
| 6,491,349 B2 * | 12/2002 | McCafferty et al. .... 298/23 DF |
| 6,547,091 B2 | 4/2003 | Hagenbuch |
| 7,257,467 B2 | 8/2007 | Hagenbuch |
| 7,369,978 B1 | 5/2008 | Hagenbuch et al. |
| 7,412,357 B1 | 8/2008 | Hagenbuch |
| 7,735,507 B2 | 6/2010 | Hagenbuch |

OTHER PUBLICATIONS

Euclid Inc,, Form 12-028 "Euclid R-85 Hauler Specifications," Sep. 1985.
Euclid Inc., Form RH-1-483 R1 "Euclid R85B Haul Units," Aug. 1994.
Duff, Elliott, "Automated Volume Measurement of Haul-Truck Loads", *CSIRO Manufacturing Science and Technology, Presented at Open Coal Cut Operations Conference*, Mackay, Queensland, Jun. 16, 2000.
"Capacity Rating—Dumper Body and Trailer Body—SAE J1363 Nov. 95," *1999 SAE Handbook-vol. 3 On-Highway Vehicles and Off-Highway Machinery, Society of Automotive Engineers, Inc.*
"Angles of Repose (Heap)", Chart, Philippi-Hagenbuch, Inc. 2003.
"Mass Wasting and the Angle of Repose," internet article from http://phoenix.liuent.edu/~divernere/notes/angle_of_repose,htm; p. 1-3, downloaded Sep. 28, 2003.
"Dynamics Angles of Repose," internet article from http://groups.physics.umn.edu/sand/theory.shtml: p. 1-2, downloaded Sep. 28, 2003.
Park, Brien, "What do you suppose is the "angle of repose"?," web article from www.nps.gov/brca/Geodetect/Earth%20Systemns/angle%20of%20repose.htm; p. 1-4, Jul. 9, 2002.
"Sand Angels," web article from www.edgerton,org/kidscorner/sandangels.html; p. 1-2, downloaded Sep. 28, 2003.
"Axial Segregatoin in Binary Granular Flows," abstract from www.aae.uiuc.edu/floatn/C%20PROJ/pp02-03f,htm; p. 1-2, downloaded Sep. 28, 2003.
"Detroit Diesel-We'll Move Mountains for You," *Australia Mining Monthly*; Aug. 2003.
*North American Quarry News*, 2003-DBT Mineral Processing ad.
"Angle of Repose and Angle of Marginal Stability," web page from http://www.hirs.de/people/mueller/papers/parallelMD99/node3.html, downloaded Sep. 28, 2003.
"Tables-Angle of Repose of Various Materials," *Caterpillar Performance Handbook*, Oct. 2002, p. 26-1.
"Density of Common Materials," *The Excavators 5$^{th}$ Edition-Hitachi*; sections 11-36:11-39 (undated).
Sideview drawing showing Ten Different Load Configurations-Load Heaps for the Caterpillar 769B Body, created by Philippi-Hagenbuch, 2003.
"Four "A" Size Isometric Drawings displaying one each possible 1.7:1 load configuration-load heap," for the Caterpillar 769B Truck; created by Philippi-Hagenbuch, 2003. 1) 1.7:1 Heap (1.1 at rear) 30.2 cu yd.; 2) 1,7:1 (True Heap) 27.5 cu yd. 3) 1,7:1 Profiled Heap (to a point) 26.0 cu yd.; and 4) 1.7:1 Profiled Heap (with top pleateau) 25.8 cu yd.
CSIRO-Common Wealth Scientific & Industrial Research Organization of Australia; website home page, downloaded Oct. 5, 2003.
"2:1 SAE—Euclid R190," *VME Americas Inc.*; p. 4, 1990.
"2:1 Field Heap—Euclid R35," *Euclid Inc.*; 1983.
Fesak, George M., et al. "*Analysis of Surface Powered Haulage Accidents*", Mine Safety and Health Administration, US Department of Labor, Sep. 1996, 11 pages total.
Liffman, Kurt et al., "*Stress In Sandpiles*" presented at the Second International Conference on CFD in the Minerals and Process Industries CSIRO, Melbourne, Australia, Dec. 6-8, 1999, pp. 83-88.
*Philippi-Hagenbuch, Inc. and LeRoy G. Hagenbuch v. Western Technology Services International, Inc.*—Case #: 1:12:cv:01099-JES-BGC—Central District of Illinois—Complaint—Mar. 30, 2012.
International Organization for Standardization. ISO 6483-1980 (E), "Earth-Moving Machinery-Dumped Bodies-Volumetric Rating," Sep. 1980.
Society of Automotive Engineers, Inc., SAE Construction, Agricultural and Off-Road Machinery Standards Manuel HS-2800 "Capacity Rating-Dumper Body and Trader Body," Jan. 1985, p. 380-381.
Caterpillar Inc., Product Division, Field Representative Information Release, N149F "769 Series B Truck," Aug. 1966, p. 1-21.
Caterpillar Inc., Brochure AE026730 "Caterpillar 769 Series B," Applicants believe available in 1967.
Caterpillar Inc., Brochure AEHQ5186 "Caterpillar 793C Mining Truck," Copyright 1996.
Euclid Inc., Form 12-015 "Euclid R-85 Specifications," Aug. 1977.
Euclid Inc., Form 12-028 "Euclid R-85 Hauler Specifications," Sep. 1985.
VME Americas Inc., Form RH-483 "Euclid R85 B," Jan. 1991.
Euclid Inc., Form RH-483 R1 "Euclid R85B Haul Units," Aug. 1994.
Caterpillar, "Mine Specific Design (MSD) Body Program," from CD distributed Oct. 2000 at Mine Expo 2000.
Conymet, "Photometry Software Tool for Volumetric and Load Distribution Study," downloaded from www.conymet.com; Nov. 26, 2002.
Conymet, "High Efficiency Body (HE Series)," from presentation given May 2002 at Haulage 2002 Conference.
Disca, "DT-HILOAD Haulage 2002," from presentation given May 2002 at Haulage 2002 Conference.
Angles of Repose Diagrams, undated (created after filing date of present application).
Selected charts and diagrams from a of Philippi-Hagenbuch, Inc., presentation undated (created after filing date of present application).
Caterpillar 769B Truck product brochure; Aug. 1966.
Caterpillar 769B Truck product brochure specification; undated (applicants believe available in the late 1960's to early 1970's).
Caterpillar 769B Truck product brochure; Mar. 1974.
Hagenbuch, LeRoy G.; "Adapting the Off-Highway Truck Body Volumetric Process to Real World Conditions," *SAE Technical Paper Series*; 2000; undated (applicants believe available in the late 1960's to early 1970's).
Duff, Elliot, "Automated Volume Measurement of Haul-Truck Loads", *CSIRO Manufacturing Science and Technology*, Presented at Open Coal Cut Operations Conference, Mackay, Queensland, Jun. 16, 2000.

(56) References Cited

OTHER PUBLICATIONS

Hagenbuch, LeRoy G., *SME Preprint 02-137* entitled "Off-Highway Truck Body True Capacity . . . Why Can't I Get Rated Payload on My Off-Highway Truck Without Hungry Boards and Tail Extensions".
"Capacity Rating—Dumper Body and Trailer Body—SAE J1363 Nov. 1995," *1999 SAE Handbook—vol. 3 On-Highway Vehicles and Off-Highway Machinery, Society of Automotive Engineers, Inc.*
"Komatsu Price Changes," *Equipment Watch Price Alert*, Aug. 2002.
Komatsu 930E-2 truck spec sheet, Jun. 2002.
Caterpillar 777D Off-Highway Truck, spec sheet, Jun. 2000.
"Angles of Repose (Heap)"; Chart, Philippi-Hagenbuch, Inc. 2003.
Oner, Mete, "Deep Dark Secrets of Geotechnical Engineering," *EJGE/Magazine*, internet article 1997; p. 1-4.
"B.2.60 Angle of Repose," web page from *Michigan State University Department of Physics and Astronomy Lecture Demonstrations Databases*, downloaded Sep. 28, 2003.
"Angle of Repose," web page from *NCSU Physics DemoRoom*, downloaded Sep. 28, 2003.
"Angle of Repose," web page from www.HyperDictionary.com, downloaded Sep. 28, 2003.
"Angle of Repose," web page from *University of Texas at Austin Physics Department*, downloaded Sep. 28, 2003.
Faris, Roger, "Find Your Safe Angle of Repose," internet article from *The Seattle Press*, downloaded Sep. 28, 2003.
"Mass Wasting and the Angle of Repose," internet article from http://phoenix.liuent.edu/~divernere/notes/angle_of_repose.htm; p. 1-3, downloaded Sep. 28, 2003.
Angle of Repose diagram from Brunner Mond, undated.
"Angle of Repose," charts from web page http://www.geol.umd.edu/~kaufman/ppt/chapter8/sld006.htm; p. 1-2, downloaded Oct. 4, 2003.
Lee, J. et al., "Angle of Repose and Angle of Marginal Stability: Molecular Dynamics of Granular Particles," abstract article from www.IOP.org/EJ/abstract/0305-4470/26/2/01; p. 1-2, Jan. 21, 1993.
"Angle of Repose," web page from www.RCRC.nm.org/glossary/gl-angle-of-repose.html, downloaded Sep. 28, 2003.
Olson, C.J. et al., "Effect of Grain Geometry on Angle of Repose and Dynamics," internet article from www.eps.org/aps/meet/MAR01/baps/abs/S338005.html, downloaded Sep. 28, 2003.
"Effect of Water on the Angle of Repose," slide 2 of 35 from internet site www.ideo.columbia.edu/dees/ees/ies2/masswasting/sld002.html, downloaded Sep. 28, 2003.
"Dynamics Angles of Repose," internet article from http://groups.physics.umn.edu/sand/theory.shtml; p. 1-2, downloaded Sep. 28, 2003.
Morisawa, Marie, "Stable Angles of Slopes," from www.beloit.edu/~SEPM/EArth_Works/Stable_angles_of_slopes.html; p. 1-4, downloaded Sep. 28, 2003.
Park, Brien, "What do you suppose is the "angle of repose"?," web article from www.nps.gov/brca/Geodetect/Earth%20Systems/angle%20of%20repose.htm; p. 1-4, Jul. 9, 2002.
"Sand Angels," web article from www.edgerton.org/kidscorner/sandangels.html; p. 1-2, downloaded Sep. 28, 2003.
"Sand Piles," web page from http://van.hep.uiuc.edu/van/qa/section/Everything_Else/Hard_to_Categorize/924816567.htm, downloaded Sep. 28, 2003.
"Slope Stability Lab," web page from www.geo.arizona.edu/K-12/azpepp/education/activity/la.html; p. 1-4, downloaded Sep. 28, 2003.
"The Angle of Repose and the Static Coefficient of Friction," web page from www.redcompservices.com/Pcourses/Phys1/repose.htm; p. 1-2, downloaded Sep. 28, 2003.
Prompalagorn, Wiroj et al., "Priction Coefficient & Angle of Repose Equipments," web abstract from http://library.kmitnb.ac.th/projects/eng/MHT/mht0096e.html, 1996.
"Slope Stability Lab," p. 1-4 (undated).

"Angle of Repose," slide 3 of presentation, http://www3.uakron.edu/geography/lrb/physf97/lectures/masswaste/sld003.htm, downloaded Sep. 28, 2003.
Chase, George G., "Solids Notes," University of Akron (undated), pp. 4-1 and 4-2.
"Mass Wasting," (undated); p. 1-7.
"CHASM: Cone Handling Algorithms for Stockpile Modeling," web article from www.cmis.csiro.au/PPI/RecentProjects/CHASM.htm; p. 1-3, downloaded Sep. 28, 2003.
"Axial Segregatoin in Binary Granular Flows," abstract from www.aae.uiuc.edu/floatn/C%20PROJ/pp02-03f.htm; p. 1-2, downloaded Sep. 28, 2003.
Bulk-Store Structures Inc. internet brochure from www.bulk-store.ca/fert.html; p. 1-3; 2000.
Commercial Hopper Tank Storage Capacities and Heights spec sheet; 2002.
"Volcanism Behind the Main Arc," web page from www.rci.rutgers.edu/~carr/fieldtrip/fieldtext/cuilapa_fldtxt.htm, downloaded Sep. 28, 2003.
"Screening Equipment," SMICO Manufacturing web page www.smico.com, downloaded Oct. 1, 2003.
"Material Bulk Density Reference Chart," SMICO Manufacturing; p. 1-20 (undated).
"Material Angles of Repose," chart from Philippi-Hagenbuch. Inc., 2003.
Photographs from Caterpillar brochures featuring: 785 Truck (4-88)—AEHQ7006 (undated).
"New Technology to Measure Mining Haul Truck Loads," CSIRO Press Release Jul. 1, 2003.
"New Technology to Measure Mining Haul Truck Loads," article from http://www.cmit.cisro.au/innovation/2003.08; p. 1-2, downloaded Aug. 22, 2003.
"A Proud History," *Euclid Haulers* brochure; p. 2; 1988.
"Earth-Moving Machinery-Dumper Bodies-Volumetric Rating," *International Standard ISO 6483*; 1980, p. 1-5.
"Caterpillar Price Changes," *Equipment Watch Price Alert*, Jan. 2003.
"Mining Lifts Goldfields Crane Hire," *Australia Mining Monthly*; Dec. 2002, p. 67.
"Detroit Diesel—We'll Move Mountains for You," *Australia Mining Monthly*; Aug. 2003.
"Trucks & Shovels," *World Mining Equipment*; Sep. 2003, vol. 27, No. 7 (including Komatsu PC 3000 ad and truck/shovel loading photos).
*North American Quarry News*, 2003—DBT Mineral Processing ad.
*Mining Engineer*, front cover; May 2003.
"P&H 2800 XP Shovel," *Perspective in Mining*, vol. 7, No. 2, p. 4.
"Excavator Selection," *Peak & Performance Practices*, front cover.
"Angle of Repose," web page from *Michigan State University*, downloaded Sep. 28, 2003.
"Angle of Repose and Angle of Marginal Stability," web page from http://www.hlrs.de/people/mueller/papers/parallelMD99/node3.html, downloaded Sep. 28, 2003.
Excerpt from "Highways in the River Environment," p. 1-4; 1975.
Hudson, Ralph G., *The Engineers' Manual*; Second Edition 1963; p. 101-102.
"Storage of Farm Crops," *Agricultural Engineers' Handbook*; p. 691, 1961.
"Approximate Angle of Repose of Various Materials," *Caterpillar Performance Handbook*; Jan. 1972, p. 25.
"Tables—Angle of Repose of Various Materials," *Caterpillar Performance Handbook*, Oct. 2002, p. 26-1.
Photographs from Caterpillar brochures featuring 785C Mining Truck (4-02)-AEHQ5328-02 (undated).
Photographs from Caterpillar brochures featuring 785/789 Truck (AEDK1468) (undated).
Photographs from Caterpillar brochures featuring 775B Truck (4-94)-AEHQ3874 (undated).
Photographs from Caterpillar brochures featuring 773E Truck (11-01)-AEHQ5456 (undated).
Photographs from Caterpillar brochures featuring 775E Truck (11-01)-AEHQ5457 (undated).

(56) References Cited

OTHER PUBLICATIONS

"Density of Common Materials," *The Excavators 5th Edition—Hitachi*; sections 11-36:11-39 (undated).
"Tables: Weight of Materials," *Caterpillar Performance Handbook Edition 33*, Oct. 2002.
Sideview drawing showing Ten Different Load Configurations—Load Heaps for the Caterpillar 769B Body, created by Philippi-Hagenbuch, 2003.
"Four "A" Size Isometric Drawings displaying one each possible 1.7:1 load configuration-load heap," for the Caterpillar 769B Truck; created by Philippi-Hagenbuch, 2003. 1) 1.7:1 Heap (1.1 at rear) 30.2 cu yd.; 2) 1.7:1 (True Heap) 27.5 cu yd. 3) 1.7:1 Profilied Heap (to a point) 26.0 cu yd.; and 4) 1.7:1 Profiled Heap (with top plateau) 25.8 cu yd.
"3M Mining" advertisement in *Mining Monthly*; Aug. 2003.
CSIRO—Common Wealth Scientific & Industrial Research Organization of Australia; website home page, downloaded Oct. 5, 2003.
"2:1 Heap," *Euclid-Hitachi* brochure; p. 4; 1995.
"2:1 SAE Heap," *Euclid-Hitachi* brochure; p. 4; 1999.
"2:1 SAE—Euclid R130," *VME Americas Inc.*; p. 4, 1989.
"2:1 SAE—Euclid R190," *VME Americas Inc.*; p. 4; 1990.
"2:1 SAE—Euclid R25," *Euclid Inc.*; 1982.
"Field Heap—Euclid R35," *Euclid Inc.*; 1983.
"SAE 2:1 Rated Heap," *VME Industries North America*; 1992.
Hagenbuch, LeRoy G., SME Preprint 02-137 entitled "Off-Highway Truck Body True Capacity . . . Why Can't I Get Rated Payload on My Off-Highway Truck Without Hungry Boards and Tail Extensions", presented at the 2002 SME Annual Meeting, Feb. 25-27, Phoenix, Arizona.
Caterpillar General Dimensions 769B Truck (undated).
Caterpillar Body Assembly 769B Truck (undated).
Fesak, George M., et al., "*Analysis of Surface Powered Haulage Accidents*", Mine Safety and Health Administration, US Department of Labor, Sep. 1996, 11 pages total.
Stentz, Anthony, et al., "*A Robotic Excavator for Autonomous Truck Loading*", Autonomous Robots 7, 1999, pp. 175-186.
Liffman, Kurt et al., "Stress In Sandpiles"presented at the *Second International Conference on CFD in the Minerals and Process Industries CSIRO*, Melbourne, Australia, Dec. 6-8, 1999, pp. 83-88.
Singh, Sanjiv, "*The State of the Art in Automation of Earthmoving*", In ASCE Journal of Aerospace Engineering, vol. 10, No. 4, Oct. 1997, pp. 1-29.
*Philippi-Hagenbuch, Inc. and LeRoy G. Hagenbuch v. Western Technology Services International, Inc.*("*Philippi-Hagenbuch v. Western*")—Case #: 1:12:cv:01099-JES-BGC—Central District of Illinois—Court Docket—Apr. 16, 2014.
*Philippi-Hagenbuch, v. Western*—Certificate of Interest—Mar. 30, 2012.
*Philippi-Hagenbuch v. Western*—Report on the Filing or Determination of an Action Regarding a Patent or Trademark—Mar. 30, 2012.
*Philippi-Hagenbuch v. Western*—Answer to Plaintiff's Complaint—May 18, 2012.
*Philippi-Hagenbuch v. Western*—Certificate of Interest—May 18, 2012.
*Philippi-Hagenbuch v. Western*—Answer to Defendant's Counterclaim—Jun. 6, 2012.
*Philippi-Hagenbuch v. Western*—Joint Proposed Discovery Plan—Jul. 6, 2012.
*Philippi-Hagenbuch v. Western*—Exhibit A of Joint Proposed Discovery Plan—Local Patent Rules of Northern District of Illinois—Available at least as early as Jul. 6, 2012.
*Philippi-Hagenbuch v. Western*—Exhibit B of Joint Proposed Discovery Plan—Proposed Dates—Jul. 6, 2012.
*Philippi-Hagenbuch v. Western*—Exhibit C of Joint Proposed Discovery Plan—Federal Circuit's E-Discovery Model Order—Available at least as early as Jul. 6, 2012.
*Philippi-Hagenbuch v. Western*—Scheduling Order—Jul. 10, 2012.
*Philippi-Hagenbuch v. Western*—Joint Motion for Entry of a Protective Order—Sep. 5, 2012.
*Philippi-Hagenbuch v. Western*—Protective Order—Sep. 6, 2012.
*Philippi-Hagenbuch v. Western*—Motion for Temporary Restraining Order and Preliminary Injunction—Sep. 25, 2012.
*Philippi-Hagenbuch v. Western*—Exhibit A of Motion for Temporary Restraining Order and Preliminary Injunction—Proposed Temporary Restraining Order and Preliminary Injunction—Sep. 25, 2012.
*Philippi-Hagenbuch v. Western*—Opposition to Motion for Temporary Restraining Order and Preliminary Injunction—Sep. 26, 2012.
*Philippi-Hagenbuch v. Western*—Exhibit A of Opposition to Motion for Temporary Restraining Order and Preliminary Injunction—U.S. Pat. No. 7,735,507.
*Philippi-Hagenbuch v. Western*—Exhibit B of Opposition to Motion for Temporary Restraining Order and Preliminary Injunction—Declaration of Frederick Reynolds—Sep. 25, 2012.
*Philippi-Hagenbuch v. Western*—Exhibit C of Opposition to Motion for Temporary Restraining Order and Preliminary Injunction—U.S. Pat. No. 5,779,092.
*Philippi-Hagenbuch v. Western*—Exhibit D of Opposition to Motion for Temporary Restraining Order and Preliminary Injunction—Westech Water Tank Presentation cited in U.S. Pat. No. 7,735,507—Available at least as early as Jun. 15, 2010.
*Philippi-Hagenbuch v. Western*—Exhibit E of Opposition to Motion for Temporary Restraining Order and Preliminary Injunction—Letter from Plaintiff—Dec. 1, 2010.
*Philippi-Hagenbuch v. Western*—Westech Motion for Leave to File Amended Answer and Counterclaim—Nov. 5, 2012.
*Philippi-Hagenbuch v. Western*—Exhibit of Motion for Leave to File Amended Answer and Counterclaim—Proposed Amended Answer to Complaint and Amended Counterclaims—Nov. 5, 2012.
*Philippi-Hagenbuch v. Western*—Response to Motion for Leave to File an Amended Answer and Counterclaims—Nov. 6, 2012.
*Philippi-Hagenbuch v. Western*—Amended Answer to Plaintiff's Original Complaint and Amended Counterclaims—Nov. 19, 2012.
*Philippi-Hagenbuch v. Western*—Amended Answer to Defendant's Amended Counterclaim—Dec. 10, 2012.
*Philippi-Hagenbuch v. Western*—Defendants Opening Claim Construction Brief—Apr. 11, 2013.
*Philippi-Hagenbuch v. Western*—Exhibit 1 of Defendants Opening Claim Construction Brief—U.S. Pat. No. 7,412,357—Appendix part 1, pp. 1-37.
*Philippi-Hagenbuch v. Western*—Exhibit 2 of Defendants Opening Claim Construction Brief—File History of U.S. Pat. No. 7,412,357—Appendix part 1, p. 38 to Appendix part 7, p. 200.
*Philippi-Hagenbuch v. Western*—Exhibit 3 of Defendants Opening Claim Construction Brief—U.S. Pat. No. 7,369,978—Appendix part 7, pp. 201-243.
*Philippi-Hagenbuch v. Western*—Exhibit 4 of Defendants Opening Claim Construction Brief—File History of U.S. Pat. No. 7,369,978—Appendix part 7, p. 244 to Appendix part 16, p. 70.
*Philippi-Hagenbuch v. Western*—Exhibit 5 of Defendants Opening Claim Construction Brief—U.S. Pat. No. 7,735,507—Appendix part 16, pp. 71-132.
*Philippi-Hagenbuch v. Western*—Exhibit 6 of Defendants Opening Claim Construction Brief—File History of U.S. Pat. No. 7,735,507—Appendix part 16, p. 133 to Appendix part 21, p. 113.
*Philippi-Hagenbuch v. Western*—Exhibit 7 of Defendants Opening Claim Construction Brief—U.S. Pat. No. 6,547,091—Appendix part 21, pp. 114-144.
*Philippi-Hagenbuch v. Western*—Exhibit 8 of Defendants Opening Claim Construction Brief—File History of U.S. Pat. No. 6,547,091—Appendix part 21, p. 145 to Appendix part 24, p. 69.
*Philippi-Hagenbuch v. Western*—Plaintiff's Motion to Compel Discovery—Apr. 15, 2013.
*Philippi-Hagenbuch v. Western*—Plaintiff's Memorandum in Support of Motion to Compel Discovery—Apr. 15, 2013.
*Philippi-Hagenbuch v. Western*—Text of Proposed Order Granting Plaintiff's Motion to Compel—Apr. 15, 2013.
*Philippi-Hagenbuch v. Western*—Exhibit A of Plaintiff's Memorandum in Support of Motion to Compel Discovery—Letter from Plaintiff Attorney Addressing Inadequacies in Response to Interrogatories, Request for Production and Request for Admission—Mar. 11, 2013.

(56) References Cited

OTHER PUBLICATIONS

*Philippi-Hagenbuch v. Western*—Exhibit B of Plaintiff's Memorandum in Support of Motion to Compel Discovery—Defendant Response to Plaintiff Letter—Mar. 25, 2013.
*Philippi-Hagenbuch v. Western*—Exhibit C of Plaintiff's Memorandum in Support of Motion to Compel Discovery—Plaintiff's Request for Production Documents—Nov. 21, 2012.
*Philippi-Hagenbuch v. Western*—Exhibit D of Plaintiff's Memorandum in Support of Motion to Compel Discovery—Plaintiff's Interrogatories—Nov. 21, 2012.
*Philippi-Hagenbuch v. Western*—Exhibit E of Plaintiff's Memorandum in Support of Motion to Compel Discovery—Westech Response to Plaintiff's Requests for Production of Documents—Jan. 14, 2013.
*Philippi-Hagenbuch v. Western*—Request to File Exhibit F of Plaintiff's Memorandum in Support of Motion to Compel Discovery Under Seal—Apr. 15, 2013.
*Philippi-Hagenbuch v. Western*—Exhibit G of Plaintiff's Memorandum in Support of Motion to Compel Discovery—Womp-int web page re Westech Tailors its Truck Bodies to Meet the Fleet—Available at least as early as Apr. 15, 2013.
*Philippi-Hagenbuch v. Western*—Exhibit H, Part 1 of Plaintiff's Memorandum in Support of Motion to Compel Discovery—Mining Media web page re Westech Sets New World Record for Truck Bodies—Available at least as early as Apr. 15, 2013.
*Philippi-Hagenbuch v. Western*—Exhibit H, Part 2 of Plaintiff's Memorandum in Support of Motion to Compel Discovery—Mining Media web page re Westech Sets New World Record for Truck Bodies—Available at least as early as Apr. 15, 2013.
*Philippi-Hagenbuch v. Western*—Exhibit of Sealed Document dated Apr. 17, 2013—Amended Complaint—Apr. 17, 2013.
*Philippi-Hagenbuch v. Western*—Amended Complaint—Apr. 22, 2013.
*Philippi-Hagenbuch v. Western*—Defendant's Opposition to Plaintiff's Motion to Compel—May 2, 2013.
*Philippi-Hagenbuch v. Western*—Exhibit A—Declaration of Frederick Reynolds—May 2, 2013.
*Philippi-Hagenbuch v. Western*—Plaintiff's Responsive Claim Construction Brief—May 9, 2013.
*Philippi-Hagenbuch v. Western*—Exhibit A of Plaintiff's Responsive Claim Construction Brief—U.S. Pat. No. 7,369,978.
*Philippi-Hagenbuch v. Western*—Exhibit B of Plaintiff's Responsive Claim Construction Brief—U.S. Pat. No. 7,412,357.
*Philippi-Hagenbuch v. Western*—Exhibit C of Plaintiff's Responsive Claim Construction Brief—U.S. Pat. No. 6,547,091.
*Philippi-Hagenbuch v. Western*—Exhibit D of Plaintiff's Responsive Claim Construction Brief—U.S. Pat. No. 7,735,507.
*Philippi-Hagenbuch v. Western*—Exhibit E of Plaintiff's Responsive Claim Construction Brief—Patent Family Diagram—May 9, 2013.
*Philippi-Hagenbuch v. Western*—Exhibit F of Plaintiff's Responsive Claim Construction Brief—Highlighted U.S. Pat. No. 7,412,357—May 9, 2013.
*Philippi-Hagenbuch v. Western*—Exhibit G of Plaintiff's Responsive Claim Construction Brief—Summary of Examination of '357 Patent—May 9, 2013.
*Philippi-Hagenbuch v. Western*—Exhibit H of Plaintiff's Responsive Claim Construction Brief—Prosecution History of U.S. Pat. No. 7,412,357, Aug. 12, 2008.
*Philippi-Hagenbuch v. Western*—Exhibit I of Plaintiff's Responsive Claim Construction Brief—New Collegiate Dictionary definitions of "hatch" and "door"—1979.
*Philippi-Hagenbuch v. Western*—Defendant's Motion for Partial Summary Judgment of Invalidity—May 9, 2013.
*Philippi-Hagenbuch v. Western*—Exhibit A of Defendant's Motion for Partial Summary Judgment of Invalidity—U.S. Pat. No. 7,412,357, Aug. 12, 2008.
*Philippi-Hagenbuch v. Western*—Exhibit B of Defendant's Motion for Partial Summary Judgment of Invalidity—U.S. Pat. No. 7,369,978, May 6, 2008.
*Philippi-Hagenbuch v. Western*—Exhibit C of Defendant's Motion for Partial Summary Judgment of Invalidity—Plaintiff's Letter regarding Construction of Preamble—Mar. 7, 2013.
*Philippi-Hagenbuch v. Western*—Exhibit D of Defendant's Motion for Partial Summary Judgment of Invalidity—Plaintiff-s Final Infringement Contentions—Jan. 29, 2013.
*Philippi-Hagenbuch v. Western*—Exhibit E of Defendant's Motion for Partial Summary Judgment of Invalidity—Plaintiff's Response to Invalidity Contentions—Nov. 1, 2012.
*Philippi-Hagenbuch v. Western*—Proposed Order—May 9, 2013.
*Philippi-Hagenbuch v. Western*—Plaintiff's Reply to Opposition to Motion to Compel—May 15, 2013.
*Philippi-Hagenbuch v. Western*—Exhibit I of Plaintiff's Reply to Opposition to Motion to Compel—Westech Blackout Period—Available at least as early as May 15, 2013.
*Philippi-Hagenbuch v. Western*—Exhibit J of Plaintiff's Reply to Opposition to Motion to Compel—Defendant's Final Invalidity Contentions—Jan. 29, 2013.
*Philippi-Hagenbuch v. Western*—Exhibit K of Plaintiff's Reply to Opposition to Motion to Compel—Plaintiff's Final Infringement Contentions with Exhibits A and B thereof—Jan. 29, 2013.
*Philippi-Hagenbuch v. Western*—Defendant's Motion for Leave to File Sur-Reply—May 20, 2013.
*Philippi-Hagenbuch v. Western*—Proposed Sur-Reply—May 20, 2013.
*Philippi-Hagenbuch v. Western*—Sur-Reply—May 21, 2013.
*Philippi-Hagenbuch v. Western*—Plaintiff-s Answer to Defendant's Counterclaims—May 23, 2013.
*Philippi-Hagenbuch v. Western*—Defendant's Reply Claim Construction Brief—May 23, 2013.
*Philippi-Hagenbuch v. Western*—Exhibit A of Defendant's Reply Claim Construction Brief—Claim Chart—May 23, 2013.
*Philippi-Hagenbuch v. Western*—Exhibit B of Defendant's Reply Claim Construction Brief—Plaintiff's Letter Regarding Preamble Construction—Mar. 7, 2013.
*Philippi-Hagenbuch v. Western*—Motion for Extension of Time to File Reply to Motion for Summary Judgment—May 29, 2013.
*Philippi-Hagenbuch v. Western*—Joint Claim Construction Chart—May 30, 2013.
*Philippi-Hagenbuch v. Western*—Judge's Opinion re Motion to Compel Discovery Allowed in Part—Jun. 3, 2013.
*Philippi-Hagenbuch v. Western*—Plaintiff's Opposition to Defendant's Motion for Partial Summary Judgment with Exhibit—Jun. 10, 2013.
*Philippi-Hagenbuch v. Western*—Notice of Supplemental Authority with Exhibit—Jul. 11, 2013.
*Philippi-Hagenbuch v. Western*—Order denying Motion for Partial Summary Judgment—Jul. 30, 2013.
*Philippi-Hagenbuch v. Western*—Order on Markman Hearing—Aug. 26, 2013.
*Philippi-Hagenbuch v. Western*—Defendant's Motion to Amend Non-Infringement Contentions—Dec. 17, 2013.
*Philippi-Hagenbuch v. Western*—Exhibit A of Defendant's Motion to Amend Non-Infringement Contentions—Claim Chart—Dec. 17, 2013.
*Philippi-Hagenbuch v. Western*—Exhibit B Defendant's Motion to Amend Non-Infringement Contentions—Excerpt of Deposition of Phillip Brinkman—Oct. 18, 2013.
*Philippi-Hagenbuch v. Western*—Exhibit C of Defendant's Motion to Amend Non-Infringement Contentions—Excerpt of Deposition of LeRoy Hagenbuch—Oct. 28, 2013.
*Philippi-Hagenbuch v. Western*—Exhibit D of Defendant's Motion to Amend Non-Infringement Contentions—Proposed Motion Granting Motion to Amend Non-Infringement Contentions—Dec. 17, 2013.
*Philippi-Hagenbuch v. Western*—Motion for Extension of Time to File Reply to Amended Non-Infringement Contentions—Dec. 30, 2013.
*Philippi-Hagenbuch v. Western*—Plaintiff's Opposition to Motion to Amend Non-Infringement Contentions—Jan. 10, 2014.
*Philippi-Hagenbuch v. Western*—Defendant's Unopposed Motion to File Reply—Jan. 15, 2014.

(56) References Cited

OTHER PUBLICATIONS

*Philippi-Hagenbuch* v. *Western*—Exhibit A of Defendant's Unopposed Motion to File Reply—Defendant's Reply to Plaintiff's Opposition—Jan. 15, 2014.
*Philippi-Hagenbuch* v. *Western*—Defendant's Motion to Compel Answers to Interrogatories—Mar. 5, 2014.
*Philippi-Hagenbuch* v. *Western*—Plaintiff's Opposition to Motion to Compel—Mar. 24, 2014.
*Philippi-Hagenbuch* v. *Western*—Motion for Leave to File Reply to Opposition to Motion to Compel with Exhibit—Mar. 31, 2014.
*Philippi-Hagenbuch* v. *Western*—Order on Motion to Compel and Motion to Amend Non-Infringement Contentions—Apr. 2, 2014.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—Feb. 5, 2015.
*Philippi-Hagenbuch* v. *Western*—Proposed Discovery Plan—Apr. 3, 2014.
*Philippi-Hagenbuch* v. *Western*—Notice (of Subpoena for Production of Records)—Apr. 29, 2014.
*Philippi-Hagenbuch* v. *Western*—Response to Defendants' Motion to Compel Damages-Related Documents—Jun. 13, 2014.
*Philippi-Hagenbuch* v. *Western*—Defendants' Joint Motion for Leave to File a Reply—Jun. 20, 2014.
*Philippi-Hagenbuch* v. *Western*—Reply in Support of Motion to Compel Damages-Related Documents—Jun. 23, 2014.
*Philippi-Hagenbuch* v. *Western*—Notice to Take Deposition of Kerry Cole—Jun. 26, 2014.
*Philippi-Hagenbuch* v. *Western*—Notice to Take Deposition of Kerry Cole—Jun. 27, 2014.
*Philippi-Hagenbuch* v. *Western*—Motion to Compel Pursuant to FRCP 37 and 45—Jun. 27, 2014.
*Philippi-Hagenbuch* v. *Western*—Motion to Quash Subpoena and for Protective Order—Jul. 11, 2014.
*Philippi-Hagenbuch* v. *Western*—Motion for Leave to File Document Under Seal—Jul. 18, 2014.
*Philippi-Hagenbuch* v. *Western*—Notice of Third Party Trinity's Motion to Quash Subpoena Seeking Deposition—Jul. 21, 2014.
*Philippi-Hagenbuch* v. *Western*—Response to Motion to Compel Pursuant to FRCP 37 and 45 (filed by Miscellaneous Party Trinity Mining & Construction Equipment, Inc.)—Jul. 23, 2014.
*Philippi-Hagenbuch* v. *Western*—Motion for Leave to File a Reply to Trinity's Response to Defendants' Motion to Compel—Jul. 23, 2014.
*Philippi-Hagenbuch* v. *Western*—Exhibits E-F to Sealed Defendants' Opposition to Plaintiffs' Motion for Leave to File a Second Amended Complaint—Aug. 8, 2014.
*Philippi-Hagenbuch* v. *Western*—Consent Motion to Seal—Aug. 8, 2014.
*Philippi-Hagenbuch* v. *Western*—Response to Motion to Quash Subpoena and for Protective Order filed by Defendants and Movant MEGA Corp.—Aug. 11, 2014.
*Philippi-Hagenbuch* v. *Western*—Order entered by Chief Judge James E. Shadid (ruling on pending discovery)—Aug. 13, 2014.
*Philippi-Hagenbuch* v. *Western*—Notice of Service of Discovery Documents—Aug. 15, 2014.
*Philippi-Hagenbuch* v. *Western*—Motion for Leave to File Reply to Defendants' Opposition to Plaintiffs' Motion for Leave to File A Second Amended Complaint—Aug. 19, 2014.
*Philippi-Hagenbuch* v. *Western*—Exhibits D, G, L to Plaintiff's Sealed Proposed Reply—Aug. 19, 2014.
*Philippi-Hagenbuch* v. *Western*—Motion for Leave to File Document Under Seal (Proposed Reply in Support of Plaintiffs' Motion for Leave to File A Second Amended Complaint)—Aug. 19, 2014.
*Philippi-Hagenbuch* v. *Western*—Notice of Defendants' Request for Oral Argument on Plaintiffs' Motion for Leave to File A Second Amended Complaint—Aug. 22, 2014.
*Philippi-Hagenbuch* v. *Western*—Motion for Leave to File Document Under Seal—Aug. 22, 2014.
*Philippi-Hagenbuch* v. *Western*—Redaction to Sealed Motion for Leave to File A Second Amended Complaint—Sep. 4, 2014.
*Philippi-Hagenbuch* v. *Western*—Redaction to Sealed Document Proposed Reply in Support of Plaintiffs' Motion for Leave to File A Second Amended Complaint—Sep. 4, 2014.
Philippi-Hagenbuch v. Western — Redaction to Sealed Document Defendants' Opposition to Plaintiffs' Motion for Leave to File A Second Amended Complaint—Sep. 4, 2014.
*Philippi-Hagenbuch* v. *Western*—Redaction to Sealed Document Defendants' Motion for Partial Summary Judgment to Limit Recovery of Damages for Alleged Infringement of the Water Tank Patents—Sep. 4, 2014.
*Philippi-Hagenbuch* v. *Western*—Notice of Defendants' Expert Designation—Sep. 5, 2014.
*Philippi-Hagenbuch* v. *Western*—Plaintiffs' Combined Opposition to Defendants' Motion for Partial Summary Judgment to Limit Recovery of Damages for Alleged Infringement of the Water Tank Patents—Sep. 19, 2014.
*Philippi-Hagenbuch* v. *Western*—Joint Motion for Extension of Time to File Parties' Joint Motion to Extend the Deadline to Filing Responsive Expert Briefs—Sep. 24, 2014.
*Philippi-Hagenbuch* v. *Western*—Defendants' Reply in Support of Their Motion for Partial Summary Judgment to Limit Recovery of Damages for Alleged Infringement of the Water Tank Patents—Oct. 3, 2014.
*Philippi-Hagenbuch* v. *Western*—Status Report—Oct. 8, 2014.
*Philippi-Hagenbuch* v. *Western*—Motion for Leave to File Defendants' Response in Opposition to Plaintiffs' Affirmative Motion for Partial Summary Judgment as to the Proper Damages Period for Alleged Infringement of the Water Tank Patents Under Seal—Oct. 10, 2014.
*Philippi-Hagenbuch* v. *Western*—Joint Motion for Extension of Time to Complete Discovery—Oct. 24, 2014.
*Philippi-Hagenbuch* v. *Western*—Plaintiffs' Reply In Support Of Its Affirmative Motion For Partial Summary Judgment As To The Proper Damages Period For The Alleged Infringement Of The Water Tank Patents—Oct. 24, 2014.
*Philippi-Hagenbuch* v. *Western*—Order entered by Chief Judge James E. Shadid: Plaintiffs' Motion for Leave to File Second Amended Complaint is Granted—Oct. 24, 2014.
*Philippi-Hagenbuch* v. *Western*—Plaintiff's Second Amended Complaint—Oct. 28, 2014.
*Philippi-Hagenbuch* v. *Western*—Redaction to Sealed Defendants' Response in Opposition to Plaintiffs' Affirmative Motion for Partial Summary Judgment As To The Proper Damages Period For The Alleged Infringement Of The Water Tank Patents—Oct. 28, 2014.
*Philippi-Hagenbuch* v. *Western*—Motion for Leave to File Defendants' Motion to Strike and Bar Plaintiffs' New Infringement Theories Under Seal—Nov. 3, 2014.
*Philippi-Hagenbuch* v. *Western*—Redaction to Sealed Defendants' Motion to Strike and Bar Plaintiffs' New Infringement Theories—Nov. 4, 2014.
*Philippi-Hagenbuch* v. *Western*—Defendants' Motion to Dismiss Plaintiffs' False Advertising Claims—Nov. 7, 2014.
*Philippi-Hagenbuch* v. *Western*—Exhibit 1 to Sealed Plaintiffs' Opposition to Defendants' Motion to Strike and Bar Plaintiffs' New Infringement Theories—Nov. 20, 2014.
*Philippi-Hagenbuch* v. *Western*—Motion for Leave to File Opposition to Defendants' Motion to Strike and Bar Plaintiffs' New Infringement Theories and Accompanying Exhibits Under Seal—Nov. 20, 2014.
*Philippi-Hagenbuch* v. *Western*—Joint Request for Telephonic Status Conference—Nov. 21, 2014.
*Philippi-Hagenbuch* v. *Western*—Joint Motion for Extension of Time to File Motion to Compel Regarding Unresolved Discovery Issues—Nov. 21, 2014.
*Philippi-Hagenbuch* v. *Western*—Response to Motion to Dismiss Plaintiffs' False Advertising Claims—Nov. 24, 2014.
*Philippi-Hagenbuch* v. *Western*—Motion for Leave to File Exhibits to Plaintiffs' Opposition to Defendants' Motion to Dismiss Plaintiffs' False Advertising Claims Under Seal—Nov. 24, 2014.

(56) References Cited

OTHER PUBLICATIONS

*Philippi-Hagenbuch* v. *Western*—Redaction to Sealed Plaintiffs' Opposition to Defendants' Motion to Strike and Bar Plaintiffs' New Infringement Theories—Nov. 25, 2014.
*Philippi-Hagenbuch* v. *Western*—Motion for Leave to File a Reply in Support of Defendants' Motion to Strike and Bar Plaintiffs' New Infringement Theories—Nov. 26, 2014.
*Philippi-Hagenbuch* v. *Western*—Motion for Leave to File a Reply Brief in Support of Motion to Dismiss Plaintiffs' False Advertising Claims—Dec. 2, 2014.
*Philippi-Hagenbuch* v. *Western*—Motion for Leave to File Unopposed Motion for Leave to Serve a Supplemental Expert Report—Dec. 3, 2014.
*Philippi-Hagenbuch* v. *Western*—Defendants' Reply Brief In Support Of Their Motion To Dismiss Plaintiffs' False-Advertising Claims—Dec. 3, 2014.
*Philippi-Hagenbuch* v. *Western*—Joint Motion to Amend/Correct Scheduling Order—Dec. 5, 2014.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—Jul. 7, 2015.
*Philippi-Hagenbuch* v. *Western*—DI 188—Motion for Leave to File Under Seal Plaintiffs' Motion for Summary Judgment that the Water Tank Maintenance Claims are Not Invalid Based on Hoss' Alleged Activities—Jan. 22, 2015.
*Philippi-Hagenbuch* v. *Western*—DI 190—Exhibits re DI 189 [Sealed Document] Plaintiffs' Motion For Summary Judgment that the Water Tank Maintenance Claims are Not Invalid Based on Hoss' Alleged Activities—Jan. 22, 2015.
*Philippi-Hagenbuch* v. *Western*—DI 191—Motion for Leave to File Under Seal Plaintiffs' Motion for Summary Judgment that Certain of Westech's Water Tanks Infringe—Jan. 22, 2015.
*Philippi-Hagenbuch* v. *Western*—DI 193—Exhibits re DI 189 [Sealed Document] Plaintiffs' Motion For Summary Judgment that Certain of Westech's Water Tanks Infringe—Jan. 22, 2015.
*Philippi-Hagenbuch* v. *Western*—DI 194—Motion for Leave to File Under Seal Defendants' Motion for Summary Judgment of Invalidity for Indefiniteness—Jan. 22, 2015.
*Philippi-Hagenbuch* v. *Western*—DI 195—Motion for Leave to File Under Seal Plaintiffs' Motion for Summary Judgment on Defendants' False Advertising Claim—Jan. 22, 2015.
*Philippi-Hagenbuch* v. *Western*—DI 198—Exhibits re DI 189 [Sealed Document] Plaintiffs' Motion For Summary Judgment on Defendants' False Advertising Claim—Jan. 22, 2015.
*Philippi-Hagenbuch* v. *Western*—DI 199—Unopposed Motion to Seal Defendants' Motion to Exclude Opinions and Testimony of Plaintiffs' Damages Expert Michael E. Tate—Jan. 22, 2015.
*Philippi-Hagenbuch* v. *Western*—DI 201—Unopposed Motion to Seal Defendants' Motion For Summary Judgment on Philippi's Lost-Profit Claim—Jan. 22, 2015.
*Philippi-Hagenbuch* v. *Western*—DI 203—Motion for Leave to File Under Seal Plaintiffs' Motion for Summary Judgment That Claims 1, 2, 8, 14, 15, 19, 20, 37, 39, 46, 55, 57, 60, 61, of U.S. Pat. No. 7,412,357 Are Not Invalid And That Certain Of Westech's Truck Bodies Infringe Claim 46 of U.S. Pat. No. 7,412,357—Jan. 22, 2015.
*Philippi-Hagenbuch* v. *Western*—DI 205—Exhibits re DI 204 [Sealed Document] Plaintiffs' Motion For Summary Judgment That Claims 1, 2, 8, 14, 15, 19, 20, 37, 39, 46, 55, 57, 60, 61, of U.S. Pat. No. 7,412,357 Are Not Invalid And That Certain Of Westech's Truck Bodies Infringe Claim 46 of U.S. Pat. No. 7,412,357—Jan. 22, 2015.
*Philippi-Hagenbuch* v. *Western*—DI 206—Motion for Leave to File Under Seal Defendants' Motion for Summary Judgment of Non-Infringement of the Load Profiling Patents—Jan. 22, 2015.
*Philippi-Hagenbuch* v. *Western*—DI 207—Motion for Leave to File Under Seal Defendants' Daubert Motion to Exclude Certain Opinions of Plaintiffs' Technical Expert Frederick Smith—Jan. 22, 2015.

*Philippi-Hagenbuch* v. *Western*—DI 208—Motion for Leave to File Excess Pages—Jan. 22, 2015.
*Philippi-Hagenbuch* v. *Western*—DI 211—Motion for Leave to File Under Seal Plaintiffs' Opposition to Defendants' Motion for Summary Judgment of Invalidity of the Water Tank Maintenance Claims—Jan. 30, 2015.
*Philippi-Hagenbuch* v. *Western*—DI 213—Exhibits re DI 212 [Sealed Document] Plaintiffs' Opposition to Defendants' Motion for Summary Judgment of Invalidity of the Water Tank Maintenance Claims—Jan. 30, 2015.
*Philippi-Hagenbuch* v. *Western*—DI 214—Order [Defendants' Motion to Dismiss False Advertising Claims (DI 148) is denied]—Feb. 2, 2015.
*Philippi-Hagenbuch* v. *Western*—DI 215—Joint Motion for Extension of Time to File—Feb. 6, 2015.
*Philippi-Hagenbuch* v. *Western*—DI 216—Reply to Response to Motion re DI 165 Motion For Leave To File Under Seal Defendants' Motion For Summary Judgment Of Non-Infringement Of The Water Tank Maintenance Claims—Feb. 6, 2015.
*Philippi-Hagenbuch* v. *Western*—DI 217—Order [granting DI 215 Motion for Extension of Time]—Feb. 9, 2015.
*Philippi-Hagenbuch* v. *Western*—DI 218—Defendants' Motion to Expedite Resolution of the Parties' Disputes Regarding the Scope of Certain Claim Terms—Feb. 13, 2015.
*Philippi-Hagenbuch* v. *Western*—DI 219—Motion for Leave to File Under Seal Plaintiffs' Opposition to Defendants' Motion for Summary Judgment on Plaintiffs' False Advertising Claims—Feb. 17, 2015.
*Philippi-Hagenbuch* v. *Western*—DI 222—Reply to Response to Motion re DI 167 Motion For Summary Judgment Of Invalidity Of The Water Tank Maintenance Claims—Feb. 17, 2015.
*Philippi-Hagenbuch* v. *Western*—DI 223—Defendants' Answer to DI 143 Amended Complaint—Feb. 17, 2015.
*Philippi-Hagenbuch* v. *Western*—DI 224—Motion for Leave to File Under Seal Plaintiffs' Response to Defendants' Motion to Exclude Opinions and Testimony of Plaintiff's Damages Expert Michael E. Tate—Feb. 23, 2015.
*Philippi-Hagenbuch* v. *Western*—DI 226—Exhibits re DI 225 [Sealed Document] Plaintiffs' Response to Defendants' Motion to Exclude Opinions and Testimony of Plaintiff's Damages Expert Michael E. Tate—Feb. 23, 2015.
*Philippi-Hagenbuch* v. *Western*—DI 227—Motion for Leave to File Under Seal Defendants' Response to Plaintiffs' Motion to Strike and Preclude Defendants from Rearguing Claim Constructions—Feb. 23, 2015.
*Philippi-Hagenbuch* v. *Western*—DI 228—Plaintiffs' Motion for Leave to File Excess Pages—Feb. 23, 2015.
*Philippi-Hagenbuch* v. *Western*—DI 229—Motion for Leave to File Under Seal Plaintiffs' Response to Defendants' Daubert Motion to Exclude Certain Opinions of Plaintiffs' Technical Expert Frederick Smith—Feb. 23, 2015.
*Philippi-Hagenbuch* v. *Western*—DI 232—Exhibits re DI 230 [Sealed Document] Plaintiffs' Opposition to Defendants' Daubert Motion to Exclude Certain Opinions of Plaintiff's Technical Expert Frederick Smith—Feb. 23, 2015.
*Philippi-Hagenbuch* v. *Western*—DI 234—Notice [Regarding a corrected Appendix re DI 231 (Sealed Document)]—Feb. 24, 2015.
*Philippi-Hagenbuch* v. *Western*—DI 235—Motion for Leave to File Under Seal Exhibits to Plaintiffs' Opposition to Defendants' Expedited Motion to Resolve the Parties' Disputes Regarding the Scope of Certain Claim Terms—Mar. 2, 2015.
*Philippi-Hagenbuch* v. *Western*—DI 236—Response to Motion re 218 Motion to Expedite Resolution of the Parties' Disputes Regarding the Scope of Certain Claim Terms—Mar. 2, 2015.
*Philippi-Hagenbuch* v. *Western*—DI 238—Corrected Exhibit No. 3 to Plaintiffs' Response to Motion to Expedite Resolution of the Parties' Disputes Regarding the Scope of Certain Claim Terms—Mar. 2, 2015.
*Philippi-Hagenbuch* v. *Western*—DI 239—Motion for Leave to File Under Seal Plaintiffs' Opposition to Defendants' Motion For Summary Judgment on Philippi-Hagenbuch's Lost-Profits Claim—Mar. 3, 2015.

(56) References Cited

OTHER PUBLICATIONS

*Philippi-Hagenbuch v. Western*—DI 241—Exhibits re DI 240 [Sealed Document] Plaintiffs' Opposition to Defendants' Motion for Summary Judgment on Philippi-Hagenbuch's Lost-Profits Claim—Mar. 3, 2015.
*Philippi-Hagenbuch v. Western*—DI 242—Motion for Leave to File Under Seal Responses to Plaintiffs' Summary Judgment Motions—Mar. 3, 2015.
*Philippi-Hagenbuch v. Western*—DI 244—Motion for Leave to File Under Seal Response to Plaintiffs' Motion for Summary Judgment on Defendants' False Advertising Claim—Mar. 3, 2015.
*Philippi-Hagenbuch v. Western*—DI 245—Response to Motion re DI 189 [Sealed Document] Summary Judgment that the Water Tank Maintenance Claims are Not Invalid Based on Hoss' Alleged Activities—Mar. 3, 2015.
*Philippi-Hagenbuch v. Western*—DI 246—Motion for Leave to File Under Seal Plaintiffs' Opposition to Defendants' Motion for Summary Judgment of Invalidity for Indefiniteness of the Collecting Data Claims of the Load Profiling Patents—Mar. 3, 2015.
*Philippi-Hagenbuch v. Western*—DI 249—Exhibits re DI 247 [Sealed Document] Plaintiffs' Opposition to Defendants' Motion for Summary Judgment of Invalidity for Indefiniteness of the Collecting Data Claims of the Load Profiling Patents—Mar. 3, 2015.
*Philippi-Hagenbuch v. Western*—DI 250—Part 1—Response to Motion re DI 186 [Sealed Document] Summary Judgment that the Westech Design Process is Not Prior Art—Mar. 3, 2015.
*Philippi-Hagenbuch v. Western*—DI 250—Part 2—Response to Motion re DI 186 [Sealed Document] Summary Judgment that the Westech Design Process is Not Prior Art—Mar. 3, 2015.
*Philippi-Hagenbuch v. Western*—DI 250—Part 3—Response to Motion re DI 186 [Sealed Document] Summary Judgment that the Westech Design Process is Not Prior Art—Mar. 3, 2015.
*Philippi-Hagenbuch v. Western*—DI 250—Part 4—Response to Motion re DI 186 [Sealed Document] Summary Judgment that the Westech Design Process is Not Prior Art—Mar. 3, 2015.
*Philippi-Hagenbuch v. Western*—DI 250—Part 5—Response to Motion re DI 186 [Sealed Document] Summary Judgment that the Westech Design Process is Not Prior Art—Mar. 3, 2015.
*Philippi-Hagenbuch v. Western*—DI 250—Part 6—Response to Motion re DI 186 [Sealed Document] Summary Judgment that the Westech Design Process is Not Prior Art—Mar. 3, 2015.
*Philippi-Hagenbuch v. Western*—DI 250—Part 7—Response to Motion re DI 186 [Sealed Document] Summary Judgment that the Westech Design Process is Not Prior Art—Mar. 3, 2015.
*Philippi-Hagenbuch v. Western*—DI 250—Part 8—Response to Motion re DI 186 [Sealed Document] Summary Judgment that the Westech Design Process is Not Prior Art—Mar. 3, 2015.
*Philippi-Hagenbuch v. Western*—DI 251—Motion for Leave to File Under Seal Plaintiffs' Opposition to Defendants' Motion for Summary Judgment of Non-Infringement of the Load Profiling Patents—Mar. 3, 2015.
*Philippi-Hagenbuch v. Western*—DI 253—Exhibits re DI 252 [Sealed Document] Plaintiffs' Opposition to Defendants' Motion for Summary Judgment of Non-Infringement of the Load Profiling Patents—Mar. 3, 2015.
*Philippi-Hagenbuch v. Western*—DI 255—Status Report (in response to Feb. 19, 2015 Order of the Court)—Mar. 5, 2015.
*Philippi-Hagenbuch v. Western*—DI 257—Defendants' Motion to Seal Exhibit A [DI 256] to Status Report—Mar. 5, 2015.
*Philippi-Hagenbuch v. Western*—DI 258—Motion to Seal Defendants' Reply Brief in Support of Their Motion for Summary Judgment on Philippi's False Advertising Claims—Mar. 6, 2015.
*Philippi-Hagenbuch v. Western*—DI 260—Motion for Leave to File Plaintiffs' Reply in Support of Their Motion to Strike and Preclude Defendants from Rearguing Claim Construction—Mar. 9, 2015.
*Philippi-Hagenbuch v. Western*—DI 261—Motion for Leave to File Under Seal Plaintiffs' Reply in Support of Their Motion to Strike and Preclude Defendants from Rearguing Claim Construction—Mar. 9, 2015.

*Philippi-Hagenbuch v. Western*—DI 263—Motion for Leave to File a Reply in Support of Defendants' Expedited Motion to Resolve the Parties' Disputes Regarding the Scope of Certain Claim Terms—Mar. 9, 2015.
*Philippi-Hagenbuch v. Western*—DI 264—Motion for Leave to File Defendants' Reply in Support of Their Daubert Motion to Exclude Certain Opinions of Plaintiffs' Technical Expert—Mar. 11, 2015.
*Philippi-Hagenbuch v. Western*—DI 265—Motion for Leave to File Under Seal Defendants' Reply in Support of Their Daubert Motion to Exclude Certain Opinions of Plaintiffs' Technical Expert—Mar. 11, 2015.
*Philippi-Hagenbuch v. Western*—DI 268—Motion for Leave to File Reply Brief in Support of Defendants' Motion to Exclude Opinions and Testimony of Plaintiffs' Damages Expert Michael E. Tate—Mar. 12, 2015.
*Philippi-Hagenbuch v. Western*—DI 269—Motion for Leave to File Under Seal Reply Brief in Support of Defendants' Motion to Exclude Opinions and Testimony of Plaintiffs' Damages Expert Michael E. Tate—Mar. 12, 2015.
*Philippi-Hagenbuch v. Western*—DI 271—Response by LeRoy G. Hagenbuch, Philippi-Hagenbuch re [DI 255] Status Report.
*Philippi-Hagenbuch v. Western*—DI 272—Reply to Response re DI-189 (Sealed Motion) for Summary Judgment that the Water Tank Maintenance Claims are Not Invalid Based on Hoss' Alleged Activities—Mar. 20, 2015.
*Philippi-Hagenbuch v. Western*—DI 273—Motion for Leave to File Under Seal Exhibit A to Plaintiffs' Reply in Support of Their Motion For Summary Judgment that the Water Tank Maintenance Claims are Not Invalid Based on Hoss' Alleged Activities—Mar. 20, 2015.
*Philippi-Hagenbuch v. Western*—DI 275—Motion for Leave to File Under Seal Plaintiffs' Reply in Support of Their Motion for Summary Judgment That Certain of Westech's Water Tanks Infringe—Mar. 20, 2015.
*Philippi-Hagenbuch v. Western*—DI 277—Exhibit B to DI 276 (Sealed Document) Plaintiffs' Reply in Support of Their Motion for Summary Judgment That Certain of Westech's Water Tanks Infringe—Mar. 20, 2015.
*Philippi-Hagenbuch v. Western*—DI 278—Plaintiffs' Motion For Leave To File Under Seal Plaintiffs' Reply In Support Of Their Motion For Summary Judgment That The Asserted Truck Body Patent Claims Are Not Invalid Based On The "Westech Design Process" and Exhibits 1-7—Mar. 20, 2015.
*Philippi-Hagenbuch v. Western*—DI 280—Exhibits to DI 279 (Sealed Document) Plaintiffs' Reply In Support Of Their Motion For Summary Judgment That The Asserted Truck Body Patent Claims Are Not Invalid Based On The "Westech Design Process"—Mar. 20, 2015.
*Philippi-Hagenbuch v. Western*—DI 281—Motion for Leave to File Under Seal Plaintiffs' Reply in Support of Their Motion for Summary Judgment on Defendants' False Advertising Claims—Mar. 20, 2015.
*Philippi-Hagenbuch v. Western*—DI 283—Exhibits to DI 282 (Sealed Document) Plaintiffs' Reply in Support of Their Motion for Summary Judgment on Defendants' False Advertising Claims—Mar. 20, 2015.
*Philippi-Hagenbuch v. Western*—DI 284—Motion for Leave to File Under Seal Defendants' Replies in Support of Their Motions for Summary Judgment (DI Nos. 197, 202 and 209)—Mar. 20, 2015.
*Philippi-Hagenbuch v. Western*—DI 286—Motion for Leave to File Under Seal Plaintiffs' Reply in Support of Their Motion for Summary Judgment That Claims 1, 2, 8, 14, 15, 19, 20, 37, 39, 46, 55, 57, 60, 61, of U.S. Pat. No. 7,412,357 Are Not Invalid And That Certain Of Westech's Truck Bodies Infringe Claim 46 of U.S. Pat. No. 7,412,357—Mar. 20, 2015.
*Philippi-Hagenbuch v. Western*—DI 288—Exhibits to DI 287 (Sealed Document) Plaintiffs' Reply in Support of Their Motion for Summary Judgment That Claims 1, 2, 8, 14, 15, 19, 20, 37, 39, 46, 55, 57, 60, 61, of U.S. Pat. No. 7,412,357 Are Not Invalid And That Certain Of Westech's Truck Bodies Infringe Claim 46 of U.S. Pat. No. 7,412,357—Mar. 20, 2015.
*Philippi-Hagenbuch v. Western*—DI 291—Redaction to DI 183 (Sealed Document) Plaintiffs' Motion to Strike and Preclude Defendants from Rearguing Claim Construction—Mar. 30, 2015.

(56) References Cited

OTHER PUBLICATIONS

*Philippi-Hagenbuch* v. *Western*—DI 292—Motion for Leave to File Plaintiffs' Surreply to Defendants' Reply in Support of Their Motion for Summary Judgment on Philippi's False Advertising Claims—Mar. 31, 2015.
*Philippi-Hagenbuch* v. *Western*—Di 293—Surreply re DI 220 (Sealed Document) Plaintiffs' Surreply to Defendants' Reply in Support of Their Motion for Summary Judgment on Philippi's False Advertising Claims—Mar. 31, 2015.
*Philippi-Hagenbuch* v. *Western*—DI 294 —Motion for Leave to File Under Seal Plaintiffs' Surreply to Defendants' Reply in Support of Their Motion for Summary Judgment on Philippi's False Advertising Claims—Mar. 31, 2015.
*Philippi-Hagenbuch* v. *Western*—DI 296—Motion for Leave to File Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. *Western*—DI 297—Surreply re DI 197 (Sealed Document) Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. *Western*—DI 298—Motion for Leave to File Under Seal Exhibit A to Plaintiffs' Surreply to Defendants' Reply in Support of Their Motion for Summary Judgment of Invalidity for Indefiniteness of the Collecting Data Claims of the Load Profiling Patents—Mar. 31, 2015.
*Philippi-Hagenbuch* v. *Western*—DI 300—Motion for Leave to File Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 301—Surreply re DI 240 (Sealed Document) Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 302—Motion for Leave to File Under Seal Exhibits A and B to Plaintiffs' Surreply to Defendants' Reply in Support of Their Motion for Summary Judgment on Philippi's Lost-Profits Claim—Mar. 31, 2015.
*Philippi-Hagenbuch* v. *Western*—DI 304—Motion for Leave to File Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 305—Surreply re DI 209 (Sealed Document) Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 306—Motion for Leave to File Under Seal Exhibit A to Plaintiffs' Surreply to Defendants' Reply in Support of Their Motion for Summary Judgment of Non-Infringement of the Load Profiling Patents—Mar. 31, 2015.
*Philippi-Hagenbuch* v. *Western*—DI 308—Order [denying Defendants' Motion to Exclude Certain Opinions of Plaintiffs' Technical Expert Frederick Smith (DI 210)]—Apr. 8, 2015.
*Philippi-Hagenbuch* v. *Western*—DI 309—Defendants' Objections to Late-Proffered Evidence Filed With Plaintiffs' Reply Briefs (Dkt. Nos. 272, 276, 282 and 287), And Proposed Surreply Briefs (Dkt . Nos. 293, 297, 301, and 305)—Apr. 14, 2015.
*Philippi-Hagenbuch* v. *Western*—DI 310—Defendants' Response to DI Nos. 292, 296, and 300—Apr. 14, 2015.
*Philippi-Hagenbuch* v. *Western*—DI 311—Plaintiffs' Motion for Reconsideration re DI 308 (Order on Sealed Motion) Apr. 17, 2015.
*Philippi-Hagenbuch* v. *Western*—DI 312—Motion to Seal Plaintiffs' Motion for Reconsideration of the Court's Order (DI 308).
*Philippi-Hagenbuch* v. *Western*—DI 314—Motion for Leave to File Plaintiffs' Answer to Defendants' Amended Counterclaims—Apr. 22, 2015.
*Philippi-Hagenbuch* v. *Western*—DI 315—Plaintiffs' Response re DI 309 Objection, Plaintiffs' Opposition to Defendants Objections to Late-Proffered Evidence Filed With Plaintiffs' Reply Briefs (DI Nos. 272, 276, 282, and 287), and Proposed Surreply Briefs (DI Nos. 293, 297, 301, and 305)—May 1, 2015.
*Philippi-Hagenbuch* v. *Western*—DI 316—Defendants' Opposition To Plaintiffs' Motion For Reconsideration of the Court's Apr. 8, 2015 Order (DI. No. 311)—May 4, 2015.
*Philippi-Hagenbuch* v. *Western*—DI 317—Motion for Leave to File Plaintiffs' Reply in Support of Their Motion For Reconsideration of the Court's Apr. 8, 2015 Order—May 5, 2015.
*Philippi-Hagenbuch* v. *Western*—DI 318—Defendants' Expedited Motion to Suspend the Pretrial Deadlines—May 6, 2015.
*Philippi-Hagenbuch* v. *Western*—DI 319—Plaintiffs' Response re DI 223 Answer to Amended Complaint, Counterclaim.
*Philippi-Hagenbuch* v. *Western*—DI 320—Order denying Plaintiff's Motion for Reconsideration (DI 311)—May 13, 2015.
*Philippi-Hagenbuch* v. *Western*—DI 321—Defendants' Motion to Strike and Bar Plaintiff's Late-Disclosed Witnesses—May 15, 2015.
*Philippi-Hagenbuch* v. *Western*—DI 322—Notice of Withdrawal of Defendants' Motion for Summary Judgment of Invalidity for Indefiniteness of the Collecting Data Claims of the Load Profiling Patents—May 18, 2015.
*Philippi-Hagenbuch* v. *Western*—DI 323—Notice of Defendants' Rule 26(a)(3) Pretrial Disclosures—May 22, 2015.
*Philippi-Hagenbuch* v. *Western*—DI 324—Exhibits A and B to Notice of Defendants' Rule 26(a)(3) Pretrial Disclosures—May 22, 2015.
*Philippi-Hagenbuch* v. *Western*—DI 325—Joint Motion to Vacate the Trial Date and Suspend Remaining Pretrial Deadlines—Jun. 1, 2015.
*Philippi-Hagenbuch* v. *Western*—DI 326—Plaintiff's Response to Motion to Strike and Bar Plaintiff's Late-Disclosed Witnesses—Jun. 1, 2015.
*Philippi-Hagenbuch* v. *Western*—DI 327—Defendants' Supplemental Status Report Related to Motion to Compel Against Trinity—Jun. 2, 2015.
*Philippi-Hagenbuch* v. *Western*—DI 329—Motion for Leave to File Document (DI-328) Under Seal—Jun. 2, 2015.
*Philippi-Hagenbuch* v. *Western*—DI 330—Order denying Plaintiff's Motion for Summary Judgment That Claims 1, 2, 8, 14, 15, 19, 20, 37, 39, 46, 55, 57, 60, 61, of U.S. Pat. No. 7,412,357 Are Not Invalid And That Certain Of Westech's Truck Bodies Infringe Claim 46 Of U.S. Pat. No. 7,412,357—Jun. 2, 2015.
*Philippi-Hagenbuch* v. *Western*—DI 331—Plaintiff's Response to Defendants' Supplemental Status Report (DI-327)—Jun. 30, 2015.
*Philippi-Hagenbuch* v. *Western*—DI 332—Defendants' Request for Hearing re Motion to Compel (DI-100)—Jul. 2, 2015.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—May 7, 2015.
*Philippi-Hagenbuch* v. *Western*—DI 128—Redaction to Sealed Document Defendants' Opposition to Plaintiffs' Motion for Leave to File A Second Amended Complaint—Sep. 4, 2014.
*Philippi-Hagenbuch* v. *Western*—DI 129—Redaction to Sealed Document Defendants' Motion for Partial Summary Judgment to Limit Recovery of Damages for Alleged Infringement of the Water Tank Patents—Sep. 4, 2014.
*Philippi-Hagenbuch* v. *Western*—DI 130—Notice of Defendants' Expert Designation—Sep. 5, 2014.
*Philippi-Hagenbuch* v. *Western*—DI 132—Plaintiffs' Combined Opposition to Defendants' Motion for Partial Summary Judgment to Limit Recovery of Damages for Alleged Infringement of the Water Tank Patents—Sep. 19, 2014.
*Philippi-Hagenbuch* v. *Western*—DI 134—Joint Motion for Extension of Time to File Parties' Joint Motion to Extend the Deadline to Filing Responsive Expert Briefs—Sep. 24, 2014.
*Philippi-Hagenbuch* v. *Western*—DI 136—Status Report—Oct. 8, 2014.
*Philippi-Hagenbuch* v. *Western*—DI 144—Redaction to Sealed Defendants' Response in Opposition to Plaintiffs' Affirmative Motion for Partial Summary Judgment As To The Proper Damages Period For The Alleged Infringement Of The Water Tank Patents —Oct. 28, 2014.

(56) References Cited

OTHER PUBLICATIONS

*Philippi-Hagenbuch* v. *Western*—DI 145—Motion for Leave to File Defendants' Motion to Strike and Bar Plaintiffs' New Infringement Theories Under Seal—Nov. 3, 2014.
*Philippi-Hagenbuch* v. *Western*—DI 147—Redaction to Sealed Defendants' Motion to Strike and Bar Plaintiffs' New Infringement Theories—Nov. 4, 2014.
*Philippi-Hagenbuch* v. *Western*—DI 148—Defendants' Motion to Dismiss Plaintiffs' False Advertising Claims—Nov. 7, 2014.
*Philippi-Hagenbuch* v. *Western*—DI 151—Exhibit 1 to Sealed Plaintiffs' Opposition to Defendants' Motion to Strike and Bar Plaintiffs' New Infringement Theories—Nov. 20, 2014.
*Philippi-Hagenbuch* v. *Western*—DI 152—Motion for Leave to File Opposition to Defendants' Motion to Strike and Bar Plaintiffs' New Infringement Theories and Accompanying Exhibits Under Seal—Nov. 20, 2014.
*Philippi-Hagenbuch* v. *Western*—DI 153—Joint Request for Telephonic Status Conference—Nov. 21, 2014.
*Philippi-Hagenbuch* v. *Western*—DI 154—Joint Motion for Extension of Time to File Motion to Compel Regarding Unresolved Discovery Issues—Nov. 21, 2014.
*Philippi-Hagenbuch* v. *Western*—DI 155—Plaintiffs' Response to Motion to Dismiss Plaintiffs' False Advertising Claims—Nov. 24, 2014.
*Philippi-Hagenbuch* v. *Western*—DI 157—Motion for Leave to File Exhibits to Plaintiffs' Opposition to Defendants' Motion to Dismiss Plaintiffs' False Advertising Claims Under Seal—Nov. 24, 2014.
*Philippi-Hagenbuch* v. *Western*—DI 158—Redaction to Sealed Plaintiffs' Opposition to Defendants' Motion to Strike and Bar Plaintiffs' New Infringement Theories—Nov. 25, 2014.
*Philippi-Hagenbuch* v. *Western*—DI 159—Motion for Leave to File a Reply in Support of Defendants' Motion to Strike and Bar Plaintiffs' New Infringement Theories—Nov. 26, 2014.
*Philippi-Hagenbuch* v. *Western*—DI 160—Defendants' Motion for Leave to File a Reply Brief in Support of Motion to Dismiss Plaintiffs' False Advertising Claims—Dec. 2, 2014.
*Philippi-Hagenbuch* v. *Western*—DI 161—Motion for Leave to File Unopposed Motion for Leave to Serve a Supplemental Expert Report—Dec. 3, 2014.
*Philippi-Hagenbuch* v. *Western*—DI 162—Defendants' Reply Brief In Support Of Their Motion To Dismiss Plaintiffs' False-Advertising Claims—Dec. 3, 2014.
*Philippi-Hagenbuch* v. *Western*—DI 163—Joint Motion to Amend/Correct Scheduling Order—Dec. 5, 2014.
*Philippi-Hagenbuch* v. *Western*—DI 164—Plaintiffs' Unopposed Motion For Leave To Serve Supplemental Expert Report—Dec. 11, 2014.
*Philippi-Hagenbuch* v. *Western*—DI 165—Defendants' Motion For Leave To File Under Seal Defendants' Motion For Summary Judgment Of Non-Infringement Of The Water Tank Maintenance Claims—Dec. 19, 2014.
*Philippi-Hagenbuch* v. *Western*—DI 167—Defendants' Motion For Summary Judgment Of Invalidity Of The Water Tank Maintenance Claims—Dec. 30, 2014.
*Philippi-Hagenbuch* v. *Western*—DI 168—Defendants' Motion For Leave To File Under Seal Exhibit E re Defendants' Motion For Summary Judgment Of Invalidity Of The Water Tank Maintenance Claims—Dec. 30, 2014.
*Philippi-Hagenbuch* v. *Western*—DI 170—Plaintiffs' Unopposed Motion For Extension Of Certain Briefing Deadlines—Jan. 6, 2015.
*Philippi-Hagenbuch* v. *Western*—DI 171—Plaintiffs' Motion For Leave To Supplement Fred P. Smith's Expert Reports—Jan. 16, 2015.
*Philippi-Hagenbuch* v. *Western*—DI 172—Plaintiffs' Motion For Leave To File Under Seal The Exhibits To Plaintiffs' Motion For Leave To Supplement Mr. Fred P. Smith's Expert Report—Jan. 16, 2015.
*Philippi-Hagenbuch* v. *Western*—DI 174—Defendants' Motion For Leave To File Under Seal Defendants' Motion For Summary Judgment On Plaintiff Philippi-Hagenbuch's False Advertising Claims Along With Accompanying Exhibits A, B, And C—Jan. 16, 2015.
*Philippi-Hagenbuch* v. *Western*—DI 176—Appendix re DI-175 [Sealed Document] Defendants' Motion For Summary Judgment On Plaintiff Philippi-Hagenbuch's False Advertising Claims—Jan. 16, 2015.
*Philippi-Hagenbuch* v. *Western*—DI 177—Redaction to DI-166 [Sealed Document] Defendants' Motion For Summary Judgment Of Non-Infringement Of The Water Tank Maintenance Claims—Jan. 20, 2015.
*Philippi-Hagenbuch* v. *Western*—DI 178—Redaction to DI-169 [Sealed Document] Exhibit E to Defendants' Motion For Summary Judgment Of Invalidity Of The Water Tank Maintenance Claims—Jan. 20, 2015.
*Philippi-Hagenbuch* v. *Western*—DI 180—Plaintiffs' Motion For Leave To File Under Seal Exhibits to Plaintiffs' Opposition to Defendants' Motion For Summary Judgment of Non-Infringement Of the Water Tank Maintenance Claims—Jan. 20, 2015.
*Philippi-Hagenbuch* v. *Western*—DI 182—Plaintiffs' Motion For Leave To File Under Seal Plaintiffs' Motion to Strike and Preclude Defendants from Rearguing Claim Construction—Jan. 22, 2015.
*Philippi-Hagenbuch* v. *Western*—DI 184—Exhibits re DI 183 [Sealed Document] Plaintiffs' Motion to Strike and Preclude Defendants from Rearguing Claim Construction—Jan. 22, 2015.
*Philippi-Hagenbuch* v. *Western*—DI 185—Plaintiffs' Motion For Leave To File Under Seal Plaintiffs' Motion for Summary Judgment that the Asserted Truck Body Patent Claims are Not Invalid Based on the Westech Design Process—Jan. 22, 2015.
*Philippi-Hagenbuch* v. *Western*—DI 187—Exhibits re DI 186 [Sealed Document] Plaintiffs' Motion For Summary Judgment that the Asserted Truck Body Patent Claims are Not Invalid Based on the Westech Design Process—Jan. 22, 2015.
*Philippi-Hagenbuch, Inc. and LeRoy G. Hagenbuch* v. *Western Technology Services International, Inc.*("*Philippi-Hagenbuch* v. *Western*")—Case #: 1:12:cv:01099-JES-BGC—Central District of Illinois—Court Docket—Mar. 1, 2016.
*Philippi-Hagenbuch* v. *Western*—DI 333—Order re Defendants' Motion to Strike and Bar Plaintiffs' New Infringement Theories (DI-146) is Granted in Part and Denied in Part—Sep. 9, 2015.
*Philippi-Hagenbuch* v. *Western*—DI 334—Order re Plaintiffs' Motion for Summary Judgment (DI-192) is Granted in Part and Denied in Part—Sep. 9, 2015.
*Philippi-Hagenbuch* v. *Western*—DI 335—Order re Defendants' Motion for Summary Judgment (DI-175) is Denied—Sep. 11, 2015.
*Philippi-Hagenbuch* v. *Western*—DI 336—Order re Motion for Summary Judgment of Invalidity of Water Tank Maintenance Claims (DI-167) is Denied—Sep. 30, 2015.
*Philippi-Hagenbuch* v. *Western*—DI 337—Order re Defendants Motion for Partial Summary Judgment to Limit Recovery of Damages for Alleged Infringement of Water Tank Patents (DI-125) is Granted in Part and Denied in Part—Sep. 30, 2015.
*Philippi-Hagenbuch* v. *Western*—DI 338—Plaintiffs' Motion for Certification of the Court's Claim Construction Orders and Memorandum of Law in Support Thereof—Sep. 30, 2015.
*Philippi-Hagenbuch* v. *Western*—DI 339—Order re Defendants' Motion for Summary Judgment of Non-Infringement of Water Tank Maintenance Claims (DI-166) is Granted—Oct. 2, 2015.
*Philippi-Hagenbuch* v. *Western*—DI 340—Joint Motion for Entry of New Pretrial Schedule—Oct. 2, 2015.
*Philippi-Hagenbuch* v. *Western*—DI 341—Motion to Withdraw as Attorney (Ida Gladys Wahlquist-Ortiz)—Oct. 9, 3015.
*Philippi-Hagenbuch* v. *Western*—DI 342—Order re Motion for Summary Judgment that Asserted Truck Body Patent Claims are Not Invalid Based on the "Westech Design Process" (DI-186) is Denied—Oct. 13, 2015.
*Philippi-Hagenbuch* v. *Western*—DI 343—Order re Defendants' Motion for Summary Judgment on Plaintiff Philippi-Hagenbuch's Lost Profits Claim (DI-202) is Denied—Oct. 13, 2015.
*Philippi-Hagenbuch* v. *Western*—DI 344—Order granting (DI-340) Joint Motion for Entry of New Pretrial Schedule—Oct. 13, 2015.
*Philippi-Hagenbuch* v. *Western*—DI 346—Defendants' Supplemental Rule 26(a)(3) Pretrial Disclosures—Oct. 13, 2015.

(56) References Cited

OTHER PUBLICATIONS

*Philippi-Hagenbuch* v. *Western*—DI 347—Plaintiffs' Supplemental Rule 26(a)(3) Pretrial Disclosures—Oct. 13, 2015.
*Philippi-Hagenbuch* v. *Western*—DI 348—Defendants' Response to Plaintiffs' Motion for the Certification of the Court's Claim Construction Orders and Memorandum of Law In Support Thereof—Oct. 16, 2015.
*Philippi-Hagenbuch* v. *Western*—DI 349—Defendants' Motion for Leave to File Exhibit A to Response in Opposition to Plaintiffs' Motion for Certification of the Court's Claim Construction Orders Under Seal—Oct. 16, 2015.
*Philippi-Hagenbuch* v. *Western*—DI 351—Defendants' Second Motion to Strike DI 347 and Bar Plaintiffs' Late-Disclosed Witnesses—Oct. 20, 2015.
*Philippi-Hagenbuch* v. *Western*—DI 352—Request for Oral Argument on Motion for Certification of the Court's Claim Construction Orders—Oct. 23, 2015.
*Philippi-Hagenbuch* v. *Western*—DI 353—Order: Defendants' Motion to Strike and Bar Plaintiffs' Late-Disclosed Witnesses is Denied—Oct. 26, 2015.
*Philippi-Hagenbuch* v. *Western*—DI 354—Order denying Plaintiffs' Motion for Certification of the Court's Claim Construction Orders [DI 338], and the Motion for Oral Argument [DI 352]—Nov. 3, 2015.
*Philippi-Hagenbuch* v. *Western*—DI 355—Plaintiffs' Motion For Leave to Supplement Mr. Fred P. Smith's Expert Reports—Nov. 4, 2015.
*Philippi-Hagenbuch* v. *Western*—DL 356—Plaintiffs' Opposition to Defendants' Second Motion to Strike And Bar Plaintiffs' Late-Disclosed Witnesses—Nov. 6, 2015.
*Philippi-Hagenbuch* v. *Western*—DI 359—Defendants' Motion For Leave to File Under Seal Exhibit A to Defendants' Motion For Leave to Supplement Dr. Frey's Expert Reports & Defendants' Response to Plaintiffs' Motion For Leave to Supplement Mr. Smith's Expert Reports [DI 355]—Nov. 12, 2015.
*Philippi-Hagenbuch* v. *Western*—DI 360—Defendants' Motion for Leave to Supplement Dr. Frey's Expert Reports and Defendants' Response to Plaintiff's Motion for Leave to Supplement Mr. Smith's Expert Reports [DI 355]—Nov. 12, 2015.
*Philippi-Hagenbuch* v. *Western*—DI 362—Joint Proposed Pretrial Conference Agenda—Nov. 12, 2015.
*Philippi-Hagenbuch* v. *Western*—DI 363—Order Denying Defendants' Second Motion to Strike and Bar Plaintiffs' Late Disclosed Witnesses [DI 351]—Nov. 12, 2015.
*Philippi-Hagenbuch* v. *Western*—DI 364—Plaintiffs' Unopposed Motion For Leave to File Under Seal Pre-Trial Order And Exhibits Thereto—Nov. 12, 2015.
*Philippi-Hagenbuch* v. *Western*—DI 366—Plaintiffs' Unopposed Motion to Maintain Under Seal Pre-Trial Order And Exhibits Thereto [DI 357 and DI 358].
*Philippi-Hagenbuch* v. *Western*—DI 367—Plaintiffs' Motion to Bar Proposed Testimony of Certain Caterpillar Inc. Witnesses Or, Alternatively, Permit Depositions—Nov. 12, 2015.
*Philippi-Hagenbuch* v. *Western*—DI 370—Defendants' Motion to Strike Philippi's Reliance On The "Continuing Wrong Doctrine"—Nov. 20, 2015.
*Philippi-Hagenbuch* v. *Western*—DI 371—Defendants' Motion to Strike And Bar Plaintiffs' New Theory of Infringement Under 35 U.S.C. § 271(G)—Nov. 20, 2015.
*Philippi-Hagenbuch* v. *Western*—DI 372—Plaintiffs' Motion to Strike And Preclude Defendants' Defense Under 35 U.S.C. § 273—Nov. 20, 2015.
*Philippi-Hagenbuch* v. *Western*—DI 373—Plaintiffs' Opposition to Defendants' Motion to Strike Reliance on the Continuing Wrong Doctrine—Nov. 30, 2015.
*Philippi-Hagenbuch* v. *Western*—DI 374—Plaintiffs' Response to Defendants' Motion For Leave to Supplement Dr. Frey's Expert Reports & Defendants' Response to Plaintiffs' Motion For Leave to Supplement Mr. Smith's Expert Reports—Nov. 30, 2015.
*Philippi-Hagenbuch* v. *Western*—DI 375—Plaintiff's Unopposed Motion For Leave to File Under Seal Plaintiffs' Opposition to Defendants' Motion to Strike and Bar Plaintiffs' New Theory of Infringement Under 35 U.S.C. § 271(g)—Nov. 30, 2015.
*Philippi-Hagenbuch* v. *Western*—DI 377—Defendants' Response to Plaintiffs' Motion to Strike Their Section 273 Prior Commercial Use Defense [DI 372]—Nov. 30, 2015.
*Philippi-Hagenbuch* v. *Western*—DI 378—Plaintiffs' Unopposed Motion for leave to File Under Seal Plaintiffs' Motions in Limine and Exhibits 1, 2, 3, 8, 9, 10, 11, 12, 18 and 19—Dec. 3, 2015.
*Philippi-Hagenbuch* v. *Western*—DI 380—Exhibits to Sealed Document [DI-379]—Dec. 3, 2015.
*Philippi-Hagenbuch* v. *Western*—DI 381—Defendants' Motion in Limine—Dec. 3, 2015.
*Philippi-Hagenbuch* v. *Western*—DI 382—Defendants' Unopposed Motion for Leave to File Under Seal Certain Exhibits to Defendants' Motion in Limine—Dec. 3, 2015.
*Philippi-Hagenbuch* v. *Western*—DI 387—Agreed Stipulation of Dismissal With Prejudice—Jan. 13, 2016.
*Philippi-Hagenbuch* v. *Western*—DI 388—Order of Dismissal With Prejudice—Jan. 15, 2016.

\* cited by examiner

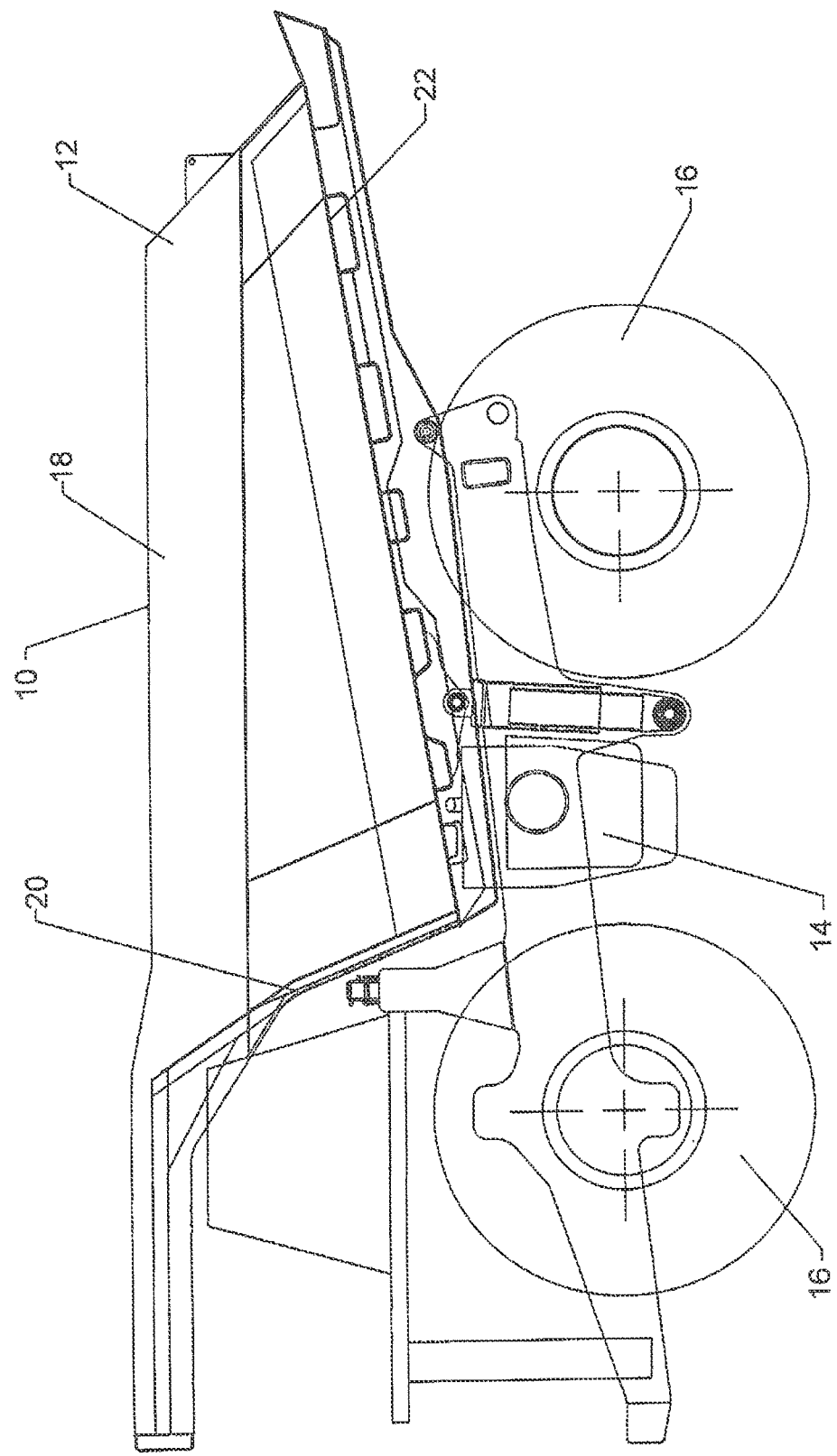

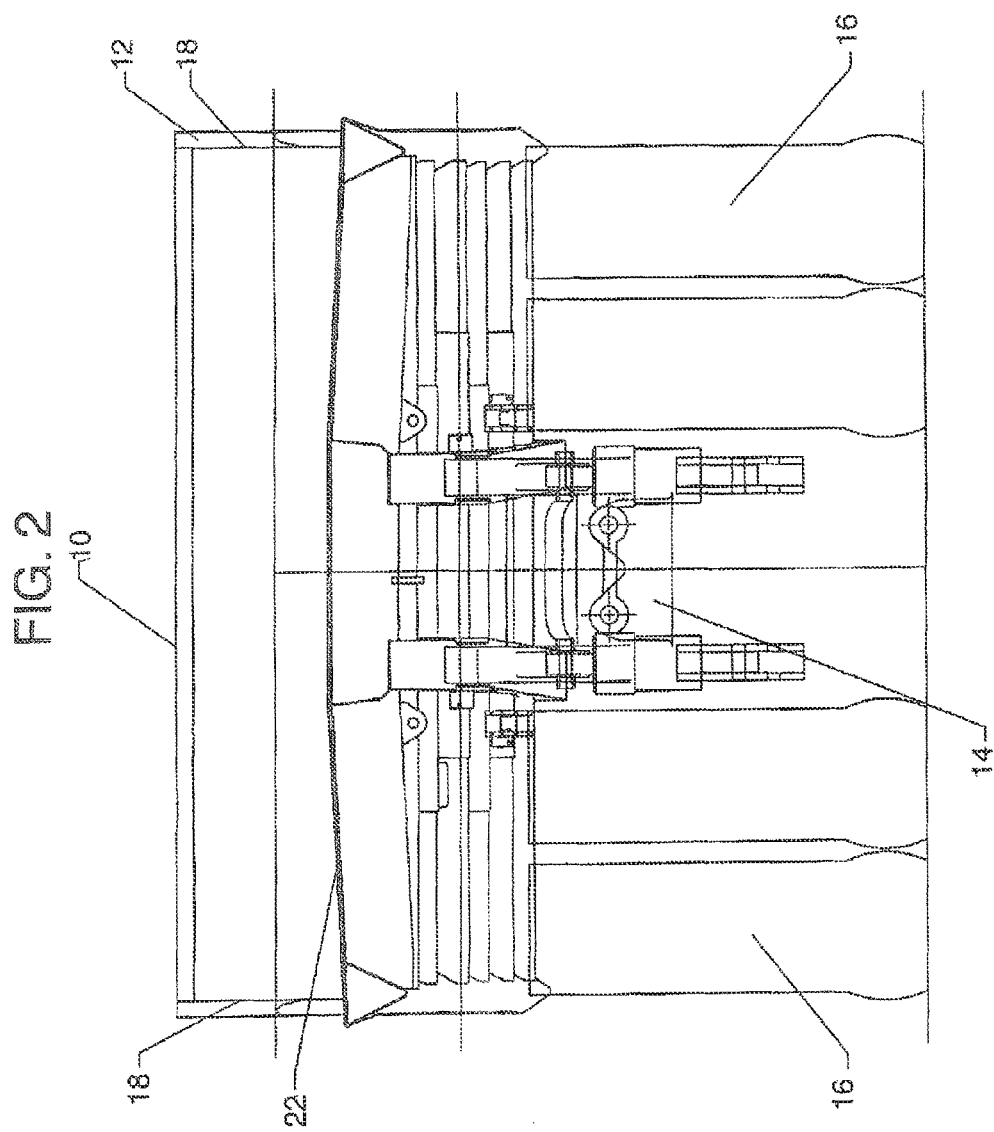

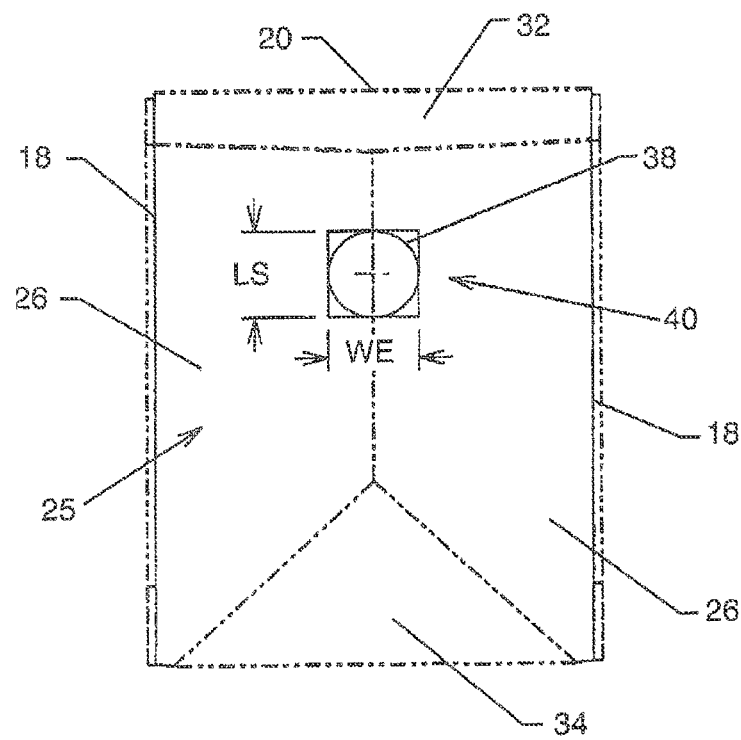
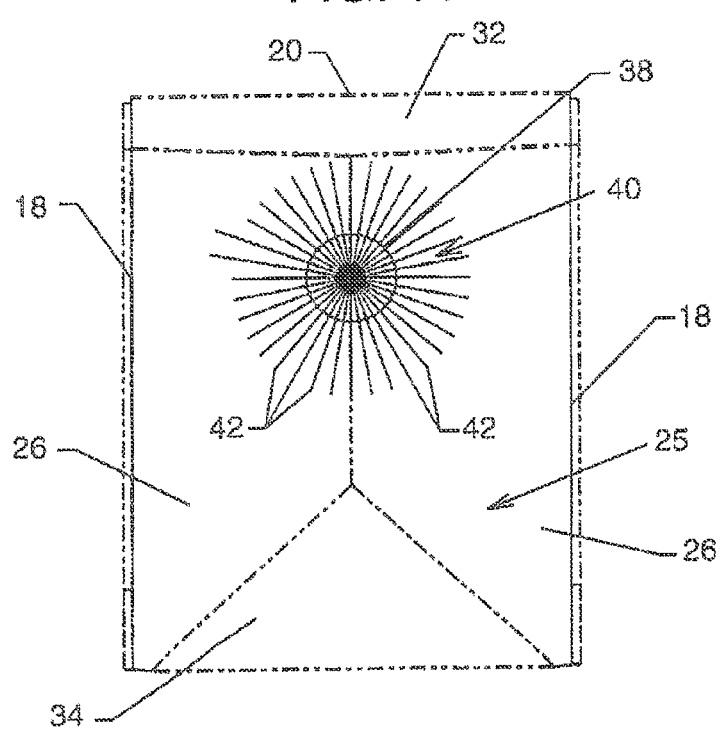

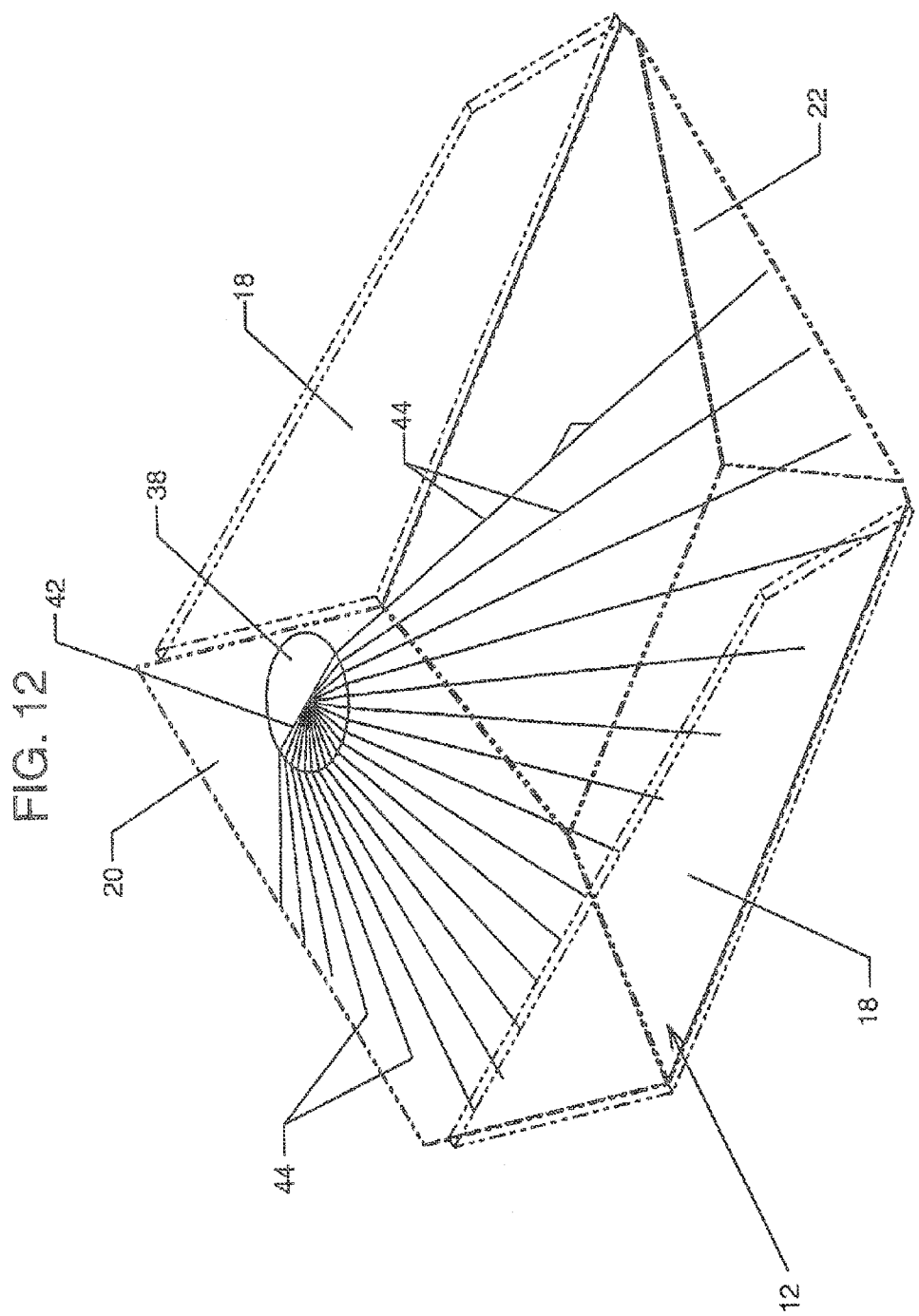

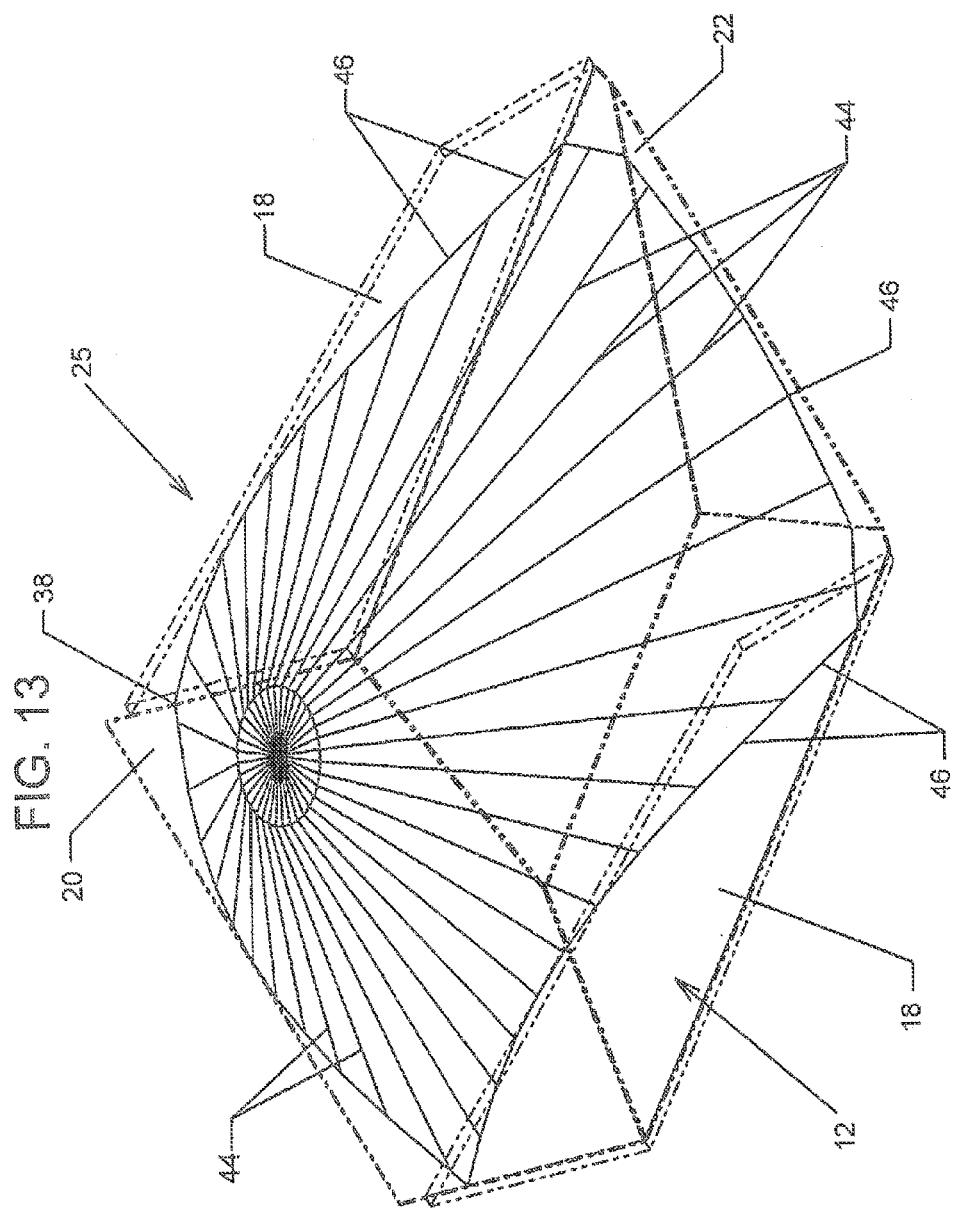

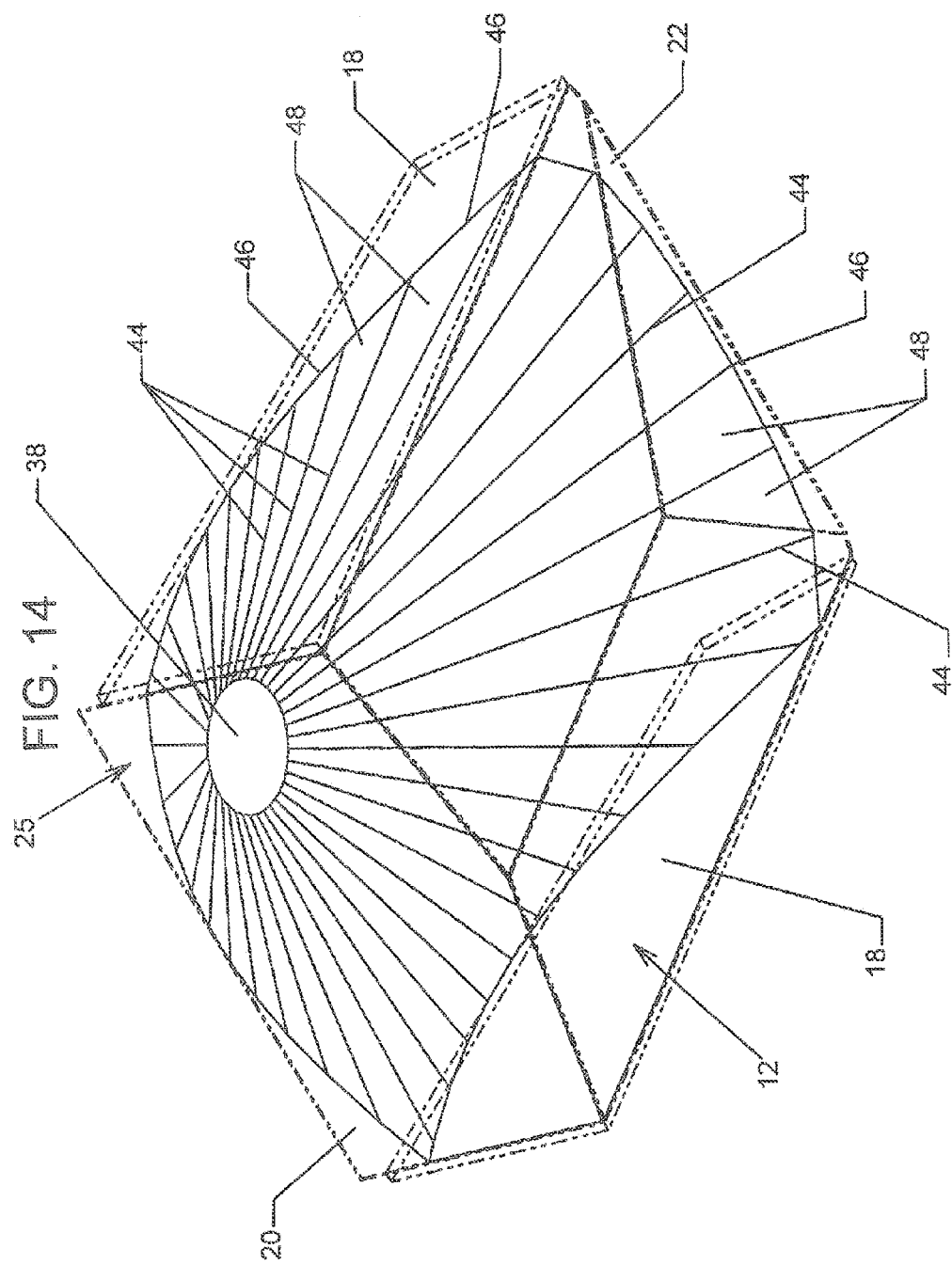

102.6 cu. m.
134.2 cu. yd.

114.8 cu. m.
150.2 cu. yd.

125.3 cu. m.
163.9 cu. yd.

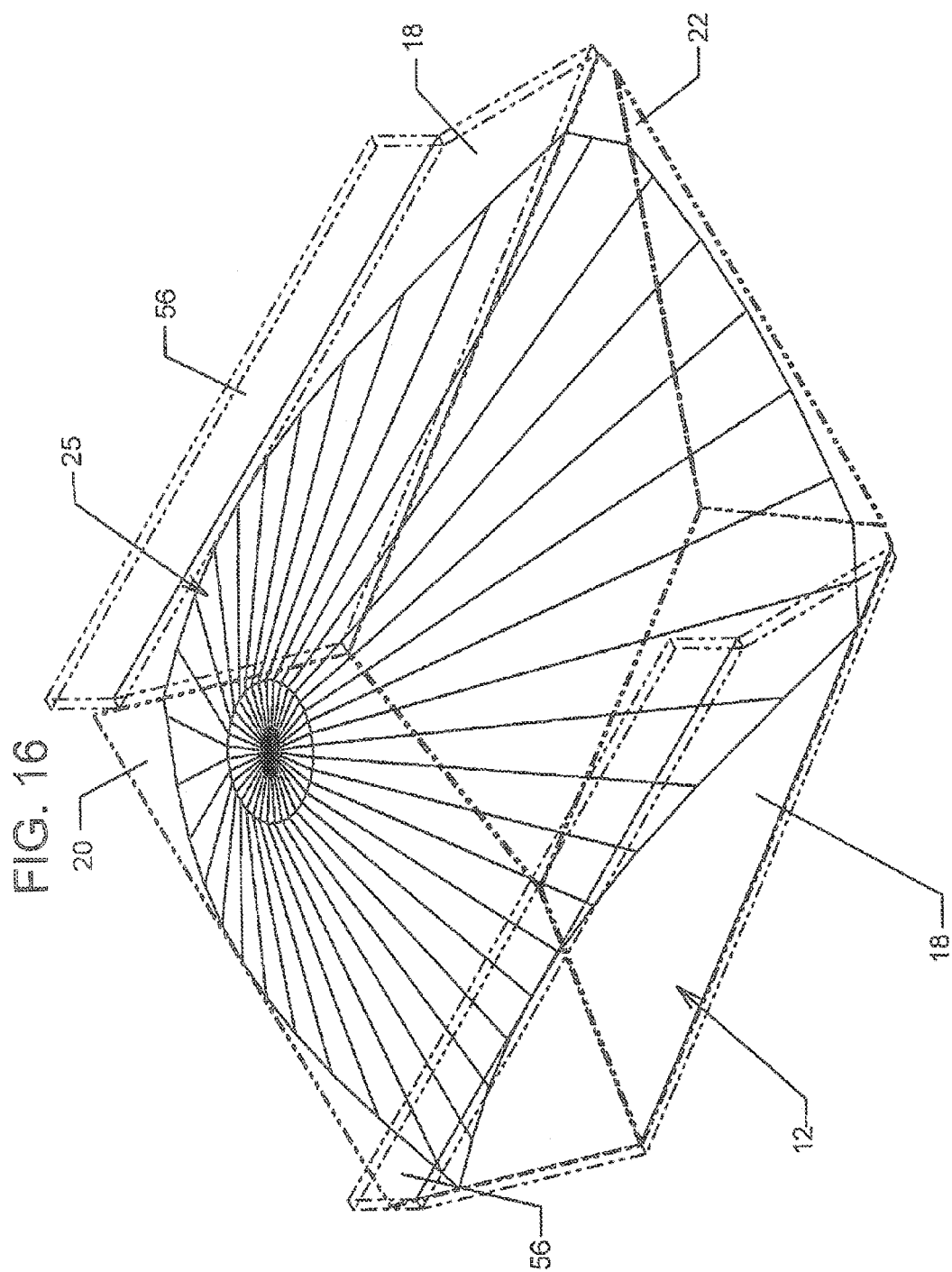

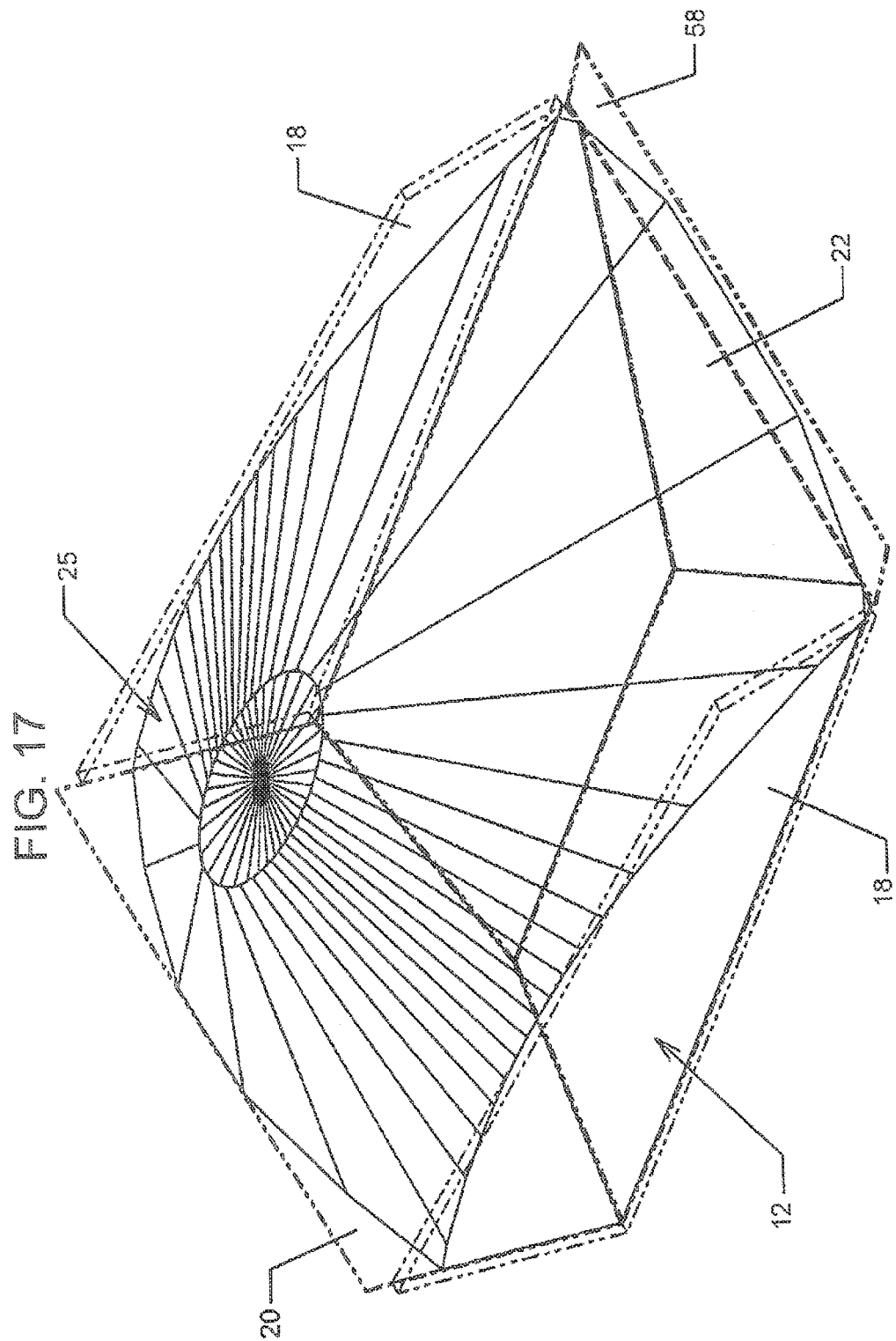

METHOD OF ESTIMATING THE VOLUMETRIC CARRYING CAPACITY OF A TRUCK BODY

CROSS-REFERENCE TO RELATED PATENT APPLICATIONS

This patent application is a continuation of U.S. patent application Ser. No. 13/628,646, filed Sep. 27, 2012, which is a continuation of U.S. patent application Ser. No. 13/048,452, filed Mar. 15, 2011, now U.S. Pat. No. 8,280,596, which is a continuation of U.S. patent application Ser. No. 11/838,079, filed Aug. 13, 2007, now U.S. Pat. No. 7,917,266, which is a continuation of U.S. patent application Ser. No. 10/286,095, filed on Nov. 1, 2002, now U.S. Pat. No. 7,257,467, which claims the benefit of U.S. Provisional Patent Application No. 60/336,064 filed Nov. 2, 2001.

FIELD OF THE INVENTION

This invention relates generally to off-highway trucks and more particularly to a method of calculating the estimated volumetric carrying capacity of the body of an off-highway truck.

BACKGROUND OF THE INVENTION

In mining and construction environments, off-highway trucks are used to haul a variety of different materials such as, for example, coal, rock, ore and overburden materials (i.e. the material overlying ore/coal deposits). Such off-highway trucks generally comprise a truck chassis or frame, which supports a truck body for receiving and carrying a load.

The carrying capacity of a truck is defined by two parameters: the weight or load carrying capacity of the truck and the volumetric carrying capacity of the truck body. These two parameters must be synchronized with the density of the material to be carried by the truck to ensure that the truck is properly utilized. If not, the truck can be operating either under capacity, i.e. short in payload, or over capacity, i.e. with a heavier than desired payload.

The truck manufacturer defines the weight carrying capacity of an off-highway truck. For a given haulage application, dividing the truck weight carrying capacity by the density of the material to be carried yields the required optimal volumetric carrying capacity for the truck body in that application.

Presently, off-highway truck manufacturers provide a volumetric capacity rating for their truck bodies that is presently based on the Society of Automotive Engineers (SAE) Standard SAE J1363 (January 1985, reaffirmed November 1995) ("the SAE standard"). Unfortunately, however, this SAE standard does not provide a very accurate estimate of the actual volumetric carrying capacity of a truck body.

The SAE standard rates the volumetric capacity of a truck body both in struck and heaped volumetric capacities. The sum of its struck volume and its 2:1 heap above the struck volume/struck line is its 2:1 heaped volume. Under the SAE standard, the struck volume of large off-highway truck dump bodies is based on an assumed struck load which extends upward from the rear edge of the floor of the truck body (on open ended truck bodies) at a 1:1 slope (corresponding to a material angle of repose of 45 degrees) to the top edge of the side walls of the body. The heaped volume is based on an assumed load heap defined by the truck body sides and the line defined by the intersection of the rear struck line and the body sides and extends upwards at a 2:1 slope (corresponding to an angle of repose of 26.6 degrees).

There are major dimensional problems with the SAE 2:1 heaped volumetric rating methodology set forth in the SAE standard. First, with respect to the struck volume calculation, there are very few materials that will stand at a 1:1 slope in a static condition let alone in a dynamic condition, i.e. when the truck is moving. Second, the heaped volume calculation is based on a different slope or material angle of repose than is used in calculating the struck volume. Thus, the SAE standard essentially assumes a load that does not have a constant material angle of repose, i.e. a load wherein the angle of repose of the load material at the rear of the truck body changes from 45 degrees to 26.6 degrees above the side walls of the truck body. In the real world, each particular side of a load heap carried in a truck body nearly always has a substantially constant angle of repose. However, it should be noted, that each side of a load heap, i.e. front, back, left and right may not always have the same angle of repose.

The third major problem with the methodology of the SAE standard is that it attempts to define the load heap by a series of four flat planes, which together resemble the roof of a house. In actuality, load heaps carried in truck bodies have a configuration that is more conical in shape.

Accordingly, the methodology of the SAE standard is based on a load model that is different in several critical respects from the actual real world configuration of a load carried by a truck body. As a result, the SAE standard produces a truck body volumetric capacity rating that does not accurately reflect the actual achievable volumetric carrying capacity of a truck body. In fact, the SAE standard consistently overrates the volumetric carrying capacity of a truck body. This is recognized in certain South American countries where the practice is to "de-rate" the SAE standard volumetric capacity of a truck body to 85% of the volumetric rating produced by the SAE standard. This method, however, also provides little more than a rough estimate of the actual volumetric carrying capacity of a truck body.

Since the SAE standard substantially overrates the actual volumetric weight carrying capacity of a truck body, off-highway truck users typically are unable to achieve the full load-carrying capabilities of their truck. Moreover, attempts to match the effective volumetric carrying capacity of a truck body with the materials being hauled and the weight carrying capacity of the truck so as to achieve full payload utilization of the truck amount to little more than guesswork because of the inaccuracy of the SAE standard. Accordingly, a need exists for a method to accurately estimate the effective volumetric carrying capacity of a truck body.

BRIEF SUMMARY OF THE INVENTION

The invention provides a method for rating or estimating the effective volumetric carrying capacity of a truck body. The method includes a Step A where a side-to-side profile of a generic load model is established by extending load side lines upward at a predetermined material angle of repose from the upper edge of each of the side walls of the truck body. In Step B, a front-to-rear profile of the generic load model is established by extending a front load line upward from the upper edge of the front wall of the truck body at the predetermined material angle of repose and a rear load line upward from at or near a rear edge of the floor of the truck body at the predetermined material angle of repose. Step C consists of defining a load plateau plane having predetermined dimensions in the front-to-rear and side-to-side profiles and determining the height of the load plateau plane. In Step D, the top profile of the generic load is then created from the side-to-side and front-to-rear profiles and the shape of the load plateau is then adjusted into a closed curve shape. In step E, the front, rear and side load lines below the final outer boundary of the load plateau are contoured into a generally conically shaped surface in which the sides of the conically shaped surface are inclined at the predetermined material angle of repose. This forms a final three-dimensional generic load model defined by the load plateau and where the generally conically shaped surface intersects the side walls, front wall and floor of the truck body. In Step F, the volume of the final three-dimensional generic load model is calculated.

BRIEF DESCRIPTION OF THE DRAWINGS

FIG. 1 is a side view of an exemplary off-highway truck having a truck body the capacity of which can be rated using the method of the present invention.

FIG. 2 is a rear view of the off-highway truck of FIG. 1.

FIG. 10 is a top view of the truck body and generic load showing how the load plateau plane is transformed into a generally circular or oval shaped load plateau.

FIG. 11 is a top view of the truck body and the generic load showing how the load plateau can be divided into pie-shaped segments.

FIG. 12 is a perspective view of the truck body and the generic load showing how the load profile lines are extended from the load plateau to the inside surface of the truck body.

FIG. 13 is a perspective view of the truck body and the generic load model showing how the lines of contact between the generic load and the inside surface of the truck body are defined.

FIG. 14 is a perspective view of the truck body and the generic load model.

FIG. 16 is a perspective view of a truck body having sideboards showing how the addition of the sideboards affect the volumetric carrying capacity rating of the truck body as calculated according to the present invention.

FIG. 17 is a perspective view of a truck body having a tail extension showing how the addition of the tail extension affects the volumetric carrying capacity rating of the truck body as calculated according to the present invention.

DETAILED DESCRIPTION OF THE INVENTION

Figure 2A:
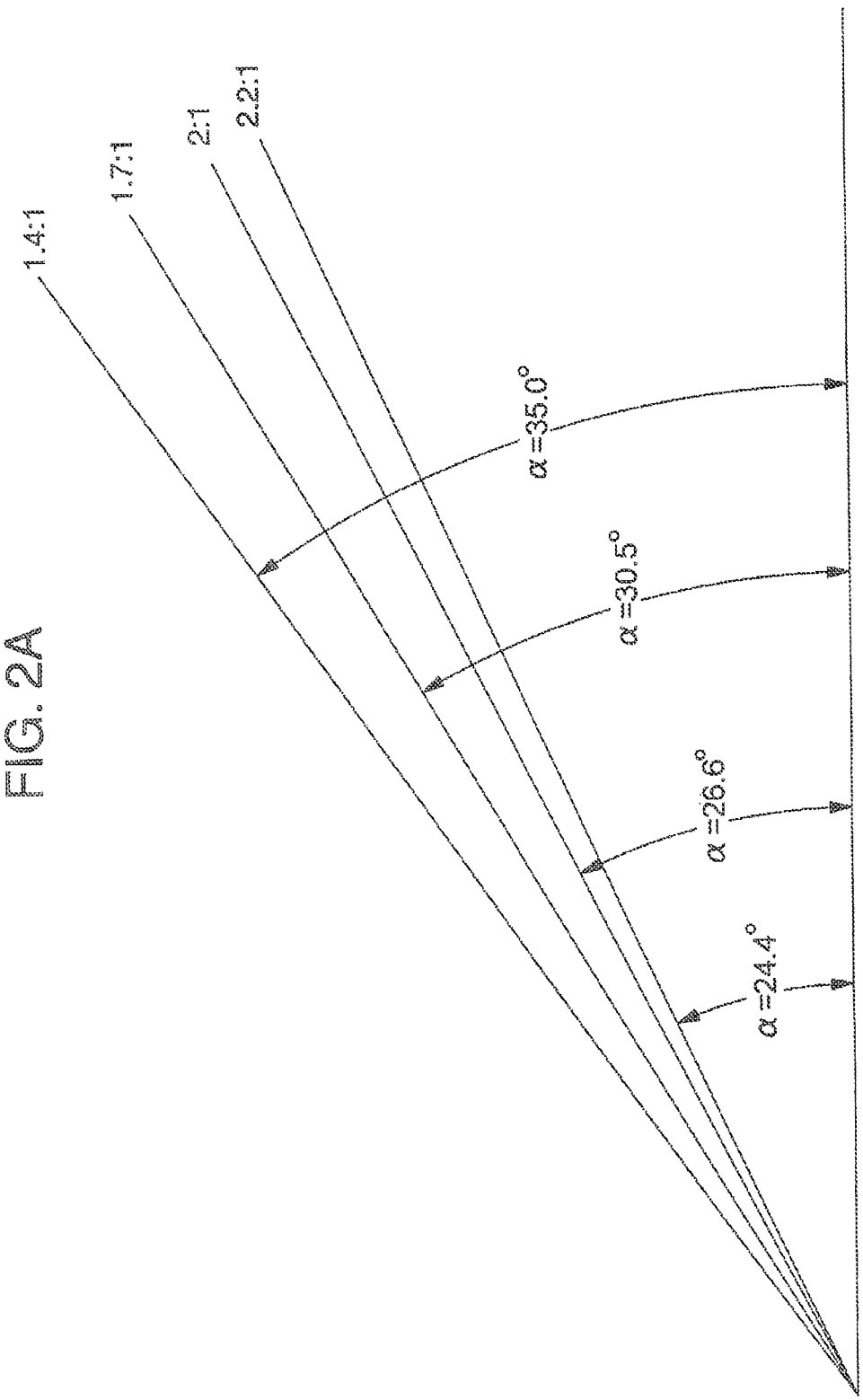
FIG. 2a is a diagram representing exemplary material angles of repose with corresponding material slopes of 2.2:1-1.4:1.

Referring now more particularly to the drawings, there is shown in FIGS. 1 and 2 an exemplary off-highway truck 10 having a body 12 the volumetric capacity of which can be rated according to the method of the present invention. The truck 10 includes a chassis 14 to which the body 12 is attached. The chassis 14, in turn, is supported by a plurality of tires 16. The truck body 12 is generally constructed of steel panels which define the shape of the body 12 and beams which form the structural framework for the body 12. The truck body 12 comprises, in this case, side walls 18, a front wall 20 or front slope and a floor 22. It will be appreciated, however, that the method of the present invention can be used on truck bodies having any suitable configuration.

In the illustrated embodiment, the truck 10 and truck body 12 are generally symmetrical about their longitudinal axes. Accordingly, as will be appreciated, reference to plural elements where only one is shown indicates that a complementary element is disposed on the side of the truck not shown (e.g., side walls 18).

In accordance with the present invention, a method is provided for much more accurately calculating or rating the volumetric carrying capacity of a truck body. In particular, the method of the present invention provides a volumetric carrying capacity rating which much more closely approximates the actual achievable effective volumetric carrying capacity of the truck body under real-life loading conditions than the volumetric rating produced using the SAE standard methodology and other similar methodologies. Thus, the present invention allows off-highway truck end users to more easily evaluate and select truck bodies for their particular haulage application. This, in turn, leads to more efficient truck utilization, i.e. trucks carrying loads more closely matched to their volumetric and weight carrying capacity.

Step 1—Establishing the Material Angle of Repose

As a first step for determining an effective volumetric capacity rating for a particular truck body, the truck body 12 in the illustrated embodiment, an assumption has to be made with regard to the load material angle of repose α. Any suitable value can be used such as illustrated in FIG. 2a. For example, in the illustrated embodiment, a 26.6 degree angle of repose α, which corresponds to a 2:1 load heap, is used for the load heap "around" the truck body 12.

While a constant angle of repose α, is used in the illustrated embodiment for ease of calculation, different angles of repose for the front, rear and sides of the load often occur. A method of designing truck bodies that can include collecting specific angle of repose data from a specific site is disclosed in copending application Ser. No. 09/333,379.

Similarly, the predetermined angle of repose α used in the method of the present invention can be based on observations of loads carried by truck bodies in the field. In such a case, the material angle of repose in the dynamic condition should be observed. Accordingly, the material angle of repose should be observed after the truck has been driven a reasonable distance and the load has stabilized.

In order to provide standard uniformity in the volumetric capacity ratings calculated according to the present invention, it may be advantageous to use a standard material angle of repose α for all calculations. Alternatively, a set of standard values may be employed with each individual standard value corresponding to a particular application (e.g., coal mine, copper mine, iron mine, etc.). Thus, when rating the volumetric capacity of a body for a particular application, the corresponding standard material angle of repose α for such material could be used. Typical angles of repose are indicated in FIG. 2a.

Step 2—Establishing Side-to-Side Profile of Generic Load

Figure 3:
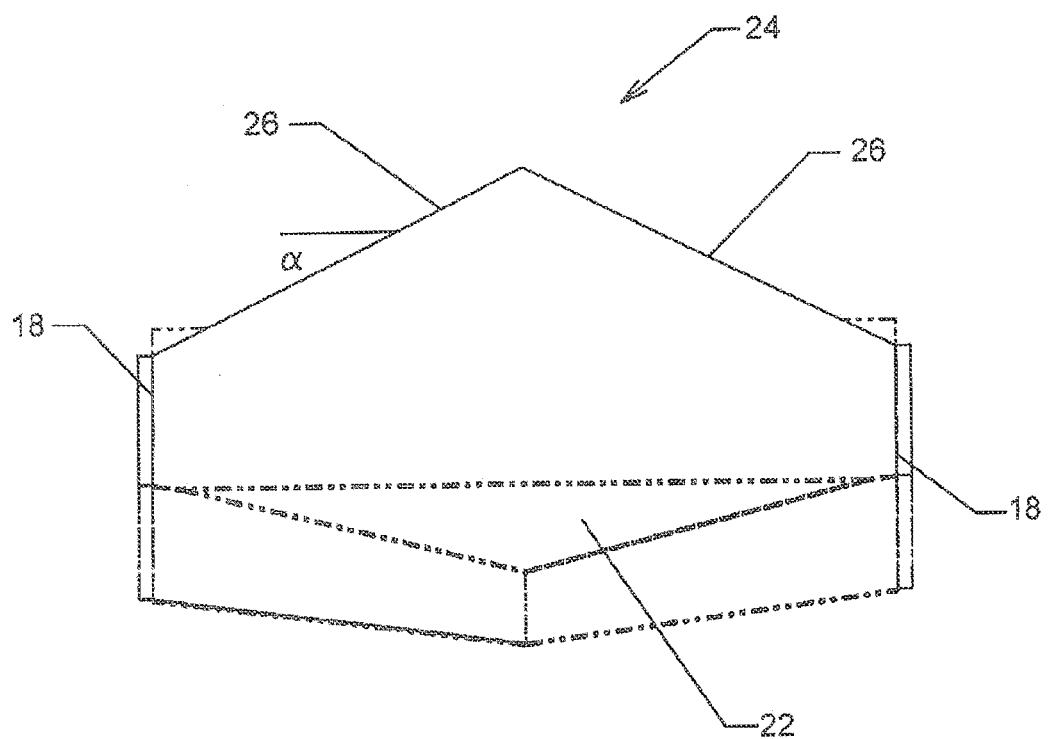
FIG. 3 is an end view of the truck body showing a step in establishing a side-to-side profile of a generic load in accordance with the present invention.

After establishing the material angle of repose α to be used, a dimensional-dimensional model of a generic load 25 (FIGS. 8, 9, 10, 11, 13, 14, 16, 17) carried by the truck body 12 is created. This generic load model 25 is preferably created using a three-dimensional solids computer aided design (CAD) system for ease of calculation. However, the present invention is not limited to being performed with CAD systems and could be performed using other systems and methods. In the illustrated embodiment, the three-dimensional generic load model 25 is begun by creating an initial side-to-side profile 24 (FIG. 3) of the generic load model 25. In particular, a load side line 26 is extended upward from the upper edge or upper inner edge of each of the side walls 18 at the predetermined angle of repose α (e.g., 26.6 degrees) to a peak in the middle using an end view of the body 12 as shown in FIG. 3.

Figure 4:
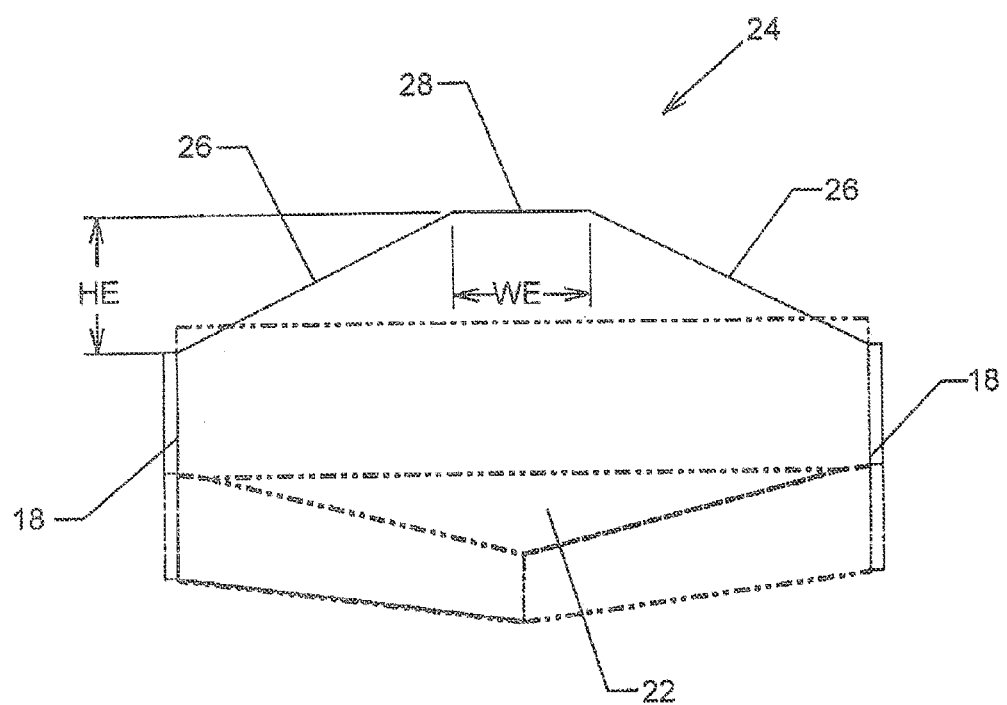
FIG. 4 is an end view of the truck body showing a further step in establishing the side-to-side profile of the generic load that includes establishing a side-to-side profile of the load plateau plane.

In reality, material carried in a dump body is rarely loaded to a perfect peak, rather a horizontally extending plateau forms on the top of the heaped load. Thus, a side-to-side profile 28 (FIG. 4) of the load plateau is next formed with a predetermined width WE in the side-to-side profile 24 of the generic load model 25 as shown in FIG. 4. In this case, the width WE of the side-to-side plateau profile line 28 is set at $1/5^{th}$ of the inside width of the truck body 12, however, any suitable value, i.e. ¼, ⅙, ⅐, ⅛, ⅑, can be used. In creating the side-to-side plateau profile line 28, the side load lines 26 of the generic load model 25 are maintained at the predetermined angle of repose α and the load peak is removed above the side-to-side plateau profile line 28, i.e. the line where the horizontal distance between the side load lines equals the predetermined width WE of the side-to-side plateau profile line 28.

Step 3—Establishing Front-to-Rear Profile of Generic Load

Figure 5:
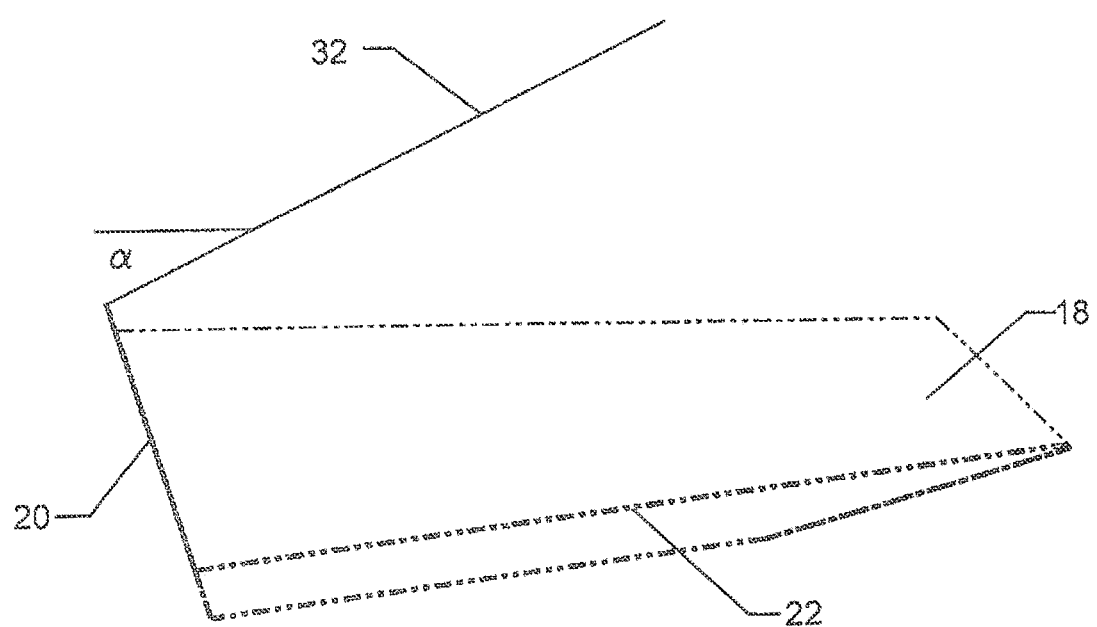
FIG. 5 is a side view of the truck body showing a step in establishing a front-to-rear profile of the generic load.

In the illustrated embodiment, as a next step, a front-to-rear profile 30 (FIG. 6) of the generic load model 25 is produced. Specifically, using a side view of the truck body 12, a front load line 32 is extended upward (FIG. 5) from the upper edge of the front body slope 20 at the predetermined material angle of repose α as shown in FIG. 5. Similarly, a rear load line 34 is extended upward (FIG. 6) from the rear edge of the floor 22 of the truck body 12 at the predetermined angle of repose α until it intersects the front load plane 32 (shown in phantom in FIG. 6). In order to take into account the possibility that loading of the rear of the body 12 to a spill point is unacceptable because of the possibility of spillage out of the rear end of the body onto a haul road, the rear load line 34 can be extended upward from a point spaced a distance D (e.g., 6 inches) inward from the rear edge of the floor 22 as shown in FIG. 6.

Figure 6:
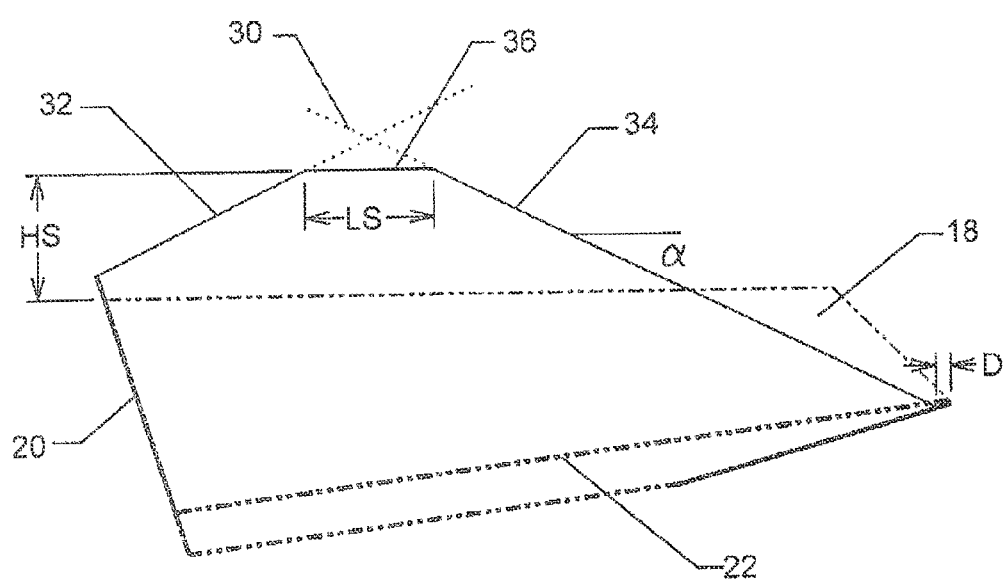
FIG. 6 is a side view of the truck body showing a further step in establishing the front-to-rear profile of the generic load that includes establishing a front-to-rear profile of the load plateau plane.

After the front and rear load lines 32, 34 are established, a front-to-rear profile 36 of the load plateau is then created (FIG. 6) with a predetermined length LS on the peak of the intersecting front and rear load lines 32, 34 as shown in FIG. 6. In this case, the front-to-rear plateau profile line 36 has a length LS equal to the width WE used in creating the side-to-side plateau profile line 28 (i.e., the step illustrated in FIG. 4). As in step 2, the angle of repose α is kept constant in creating the front-to-rear plateau profile line 36.

Step 4—Determining Maximum Height of Generic Load Model

Figure 7:
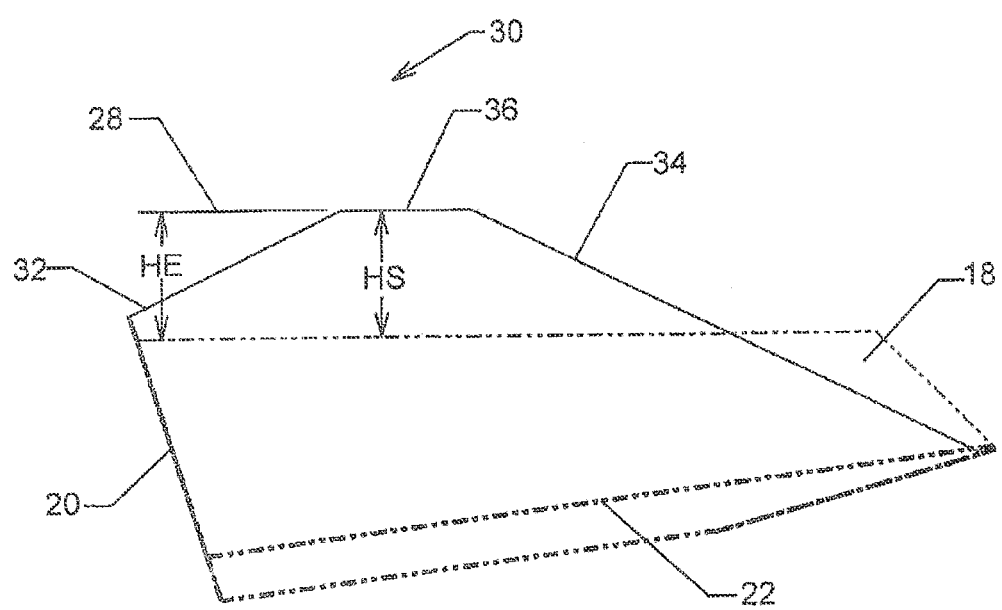
FIG. 7 is a side view of the truck body showing the difference in height between the front-to-rear profile of the load plateau plane and the side-to-side profile of the load plateau plane.

As a next step, the maximum height of the generic load model 25 is determined. This is accomplished by comparing the height HE of the side-to-side plateau profile line 28 and the height HS front-to-rear plateau profile line 36, such as shown in FIG. 7. Specifically, the final height HF (FIG. 8) of the generic load model 25 is set at the lower of the height HE of the side-to-side plateau profile line 28 and the height HS of the front-to-rear plateau profile line 36 (assuming that these two heights are different). The lower height is used because the height of an actual load in the body 12 will be limited by either the length or width of the body (unless such as in ideal situations HS equals HE). For example, in the illustrated embodiment HE exceeds HS. The true height of an actual load will not reach HE because the body 12 is not long enough at the chosen material angle of repose α to hold a load of that size.

Figure 8:
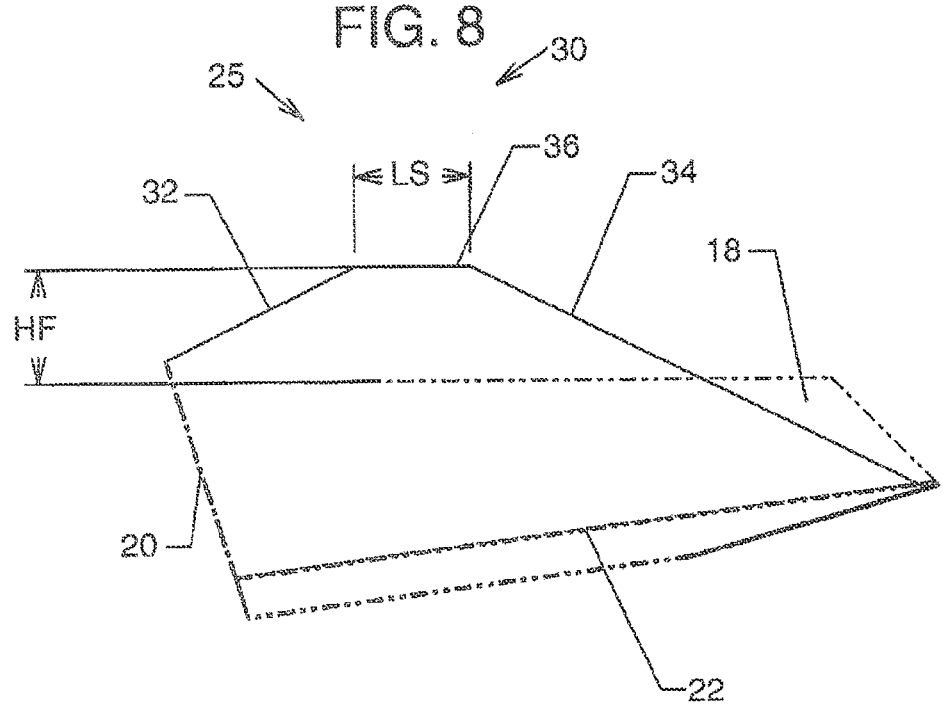
FIG. 8 is a side view of the truck body showing the final front-to-rear profile of the generic load.
Figure 9:
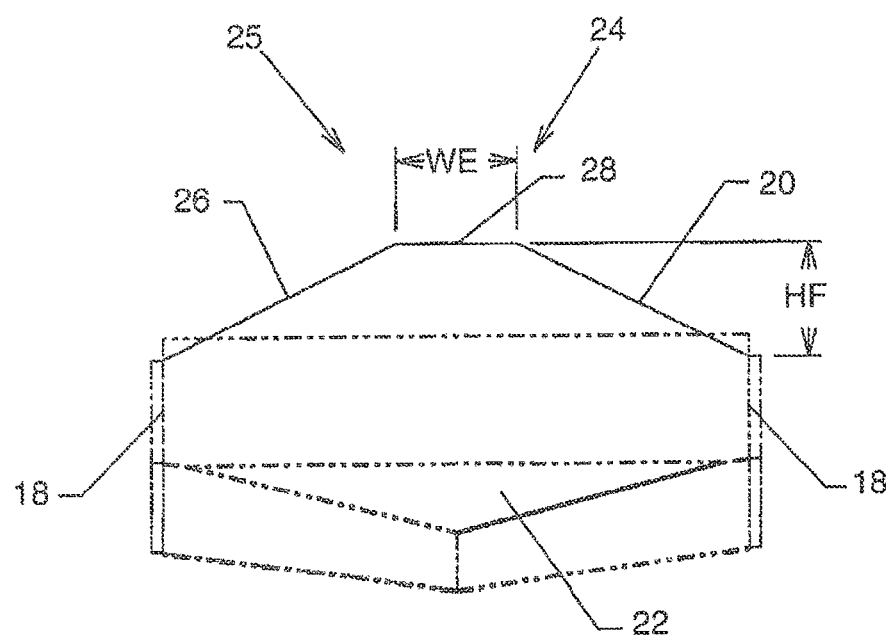
FIG. 9 is an end view of the truck body showing the final side-to-side profile of the generic load.

Once the final height HF is determined, both the side-to-side and front-to-rear plateau profiles 28, 36 are set at the final height HF above the body sides 18 (FIGS. 8 and 9 respectively). In particular, the height of the plateau line in the profile (front-to-rear or side-to-side) having the higher height above the body side 18 is lowered to the height of the lower plateau line. Thus, at this point, the plateau lines should be at the final height HF in both the side-to-side and front-to-rear profiles 24, 30 of the generic load model 25 as shown in FIGS. 8 and 9. In the profile in which the height of the plateau line was lowered, the plateau line will be longer than the predetermined distance used to initially define the plateau (i.e., WE will no longer equal LS) because the material angle of repose α of the side, front and rear load lines 26, 32, 34 remains constant.

Note that the plateau width WE should not be more than 20% larger than the original width established in Step 2. While load heaps can easily run the length of the body, load heaps running the width of the truck body are seldom if ever achievable. If the plateau width WE does exceed the original width by more than 20% it will indicate that the point where the load contacts the body side walls 18 is below the top of the side walls 18 or that the angle of repose for the material running to the body sides is less than that established in Step 1, i.e. the loading tool has to artificially push material sideways to get material to reach the top of the body side walls. When designing a body, this problem can be corrected by lengthening the body in the front-to-rear view or profile.

It will be appreciated that the steps 2 and 3 described above and illustrated in FIGS. 3-7 do not have to be performed in any particular order so long as side-to-side and front-to-rear profiles 24, 30 of the generic load model 25 are established and the height and length of the load plateau lines are defined. For example, the front-to-rear profile 30 of the generic load model 25 can be produced prior to the side-to-side profile 24.

Step 5—Defining Shape of Load Plateau

At this stage, the side, front and rear load lines 26, 32, 34 and the load plateau lines 28, 36 define the generic load model 25. In order to more accurately reflect the shape of an actual load heap carried in a truck body 12, the generic load model 25 is next molded into a more conical shape. In the illustrated embodiment, this is accomplished by first creating a top load plateau profile 40 which in most cases will be oblong in nature though it could also be round if HS and HE are the same height. As shown in FIG. 10, the load plateau as defined by the side-to-side and front-to-rear profile lines initially has a rectangular shape when viewed from the top (because WE no longer equals LS). To more accurately reflect the shape of an actual load plateau, this rectangular shape must be converted into a rounder oblong or oval shape. In this case, the final top load plateau profile 40 is produced by inscribing an oval or circle within the lines of the rectangle. This oval or circle becomes the outer boundary of the load plateau 38.

Step 6—Contouring Generic Load to Produce a More Conical Shape

Using the oval shaped top profile 40 of the load plateau 38 as the starting point, the side, front and rear load lines 26, 32, 34 of the generic load model 25 produced in creating the side-to-side and front-to-rear profiles 24, 30 of the generic load model 25 are contoured so that the generic load model 25 more closely resembles a conical shape. In this case, the oval shaped load plateau top profile 40 is divided into a plurality of pie-shaped increments by boundary lines 42 as shown in FIG. 11. The boundary lines 42 defining the pie shaped increments are spaced at equal angular intervals. In the illustrated embodiment, the load plateau 38 is divided into thirty-six 10 degree pie-shaped segments. Since it is anticipated that an actual load will be symmetrical about the centerline of the body 12, the load plateau 38 could be divided in increments 42 only to one side of the body 12 (e.g., eighteen 10 degree increments). The opposite side of the generic load model 25 would then be formed as a mirror image of the side divided into increments.

For each pie-shaped segment boundary line 42, a contour line 44 (FIG. 12) is extended downward at the predetermined material angle of repose α from the edge of the oval-shaped plateau 38 perpendicular to the tangent line of the plateau 38 at that point until the contour line 44 intersects the inside surface of the truck body 12 as shown in FIG. 12. To define the lines of contact between the generic load model 25 and the sidewalls 18, front slope 20 and floor 22 of the body 12, the points where the contour lines 44 contact the inside of the truck body 12 are connected to form a series of contact line segments 46 as shown in FIG. 13. The upper surface of the load model 25 is then formed (FIG. 14) by extending a contour plane 48 between each adjacent pair of the contour lines 44 from the plateau to the respective body contact line segment 46. These contour planes 48 shape the upper surface of the generic load model 25 into a generally conical shape as shown in FIG. 14.

Step 7—Determine Volumetric Capacity Rating

The volume of the three-dimensional generic load model 25 is then calculated. This volume represents the effective volumetric carrying capacity of the truck body 12. The volume of the dimensional-dimensional generic load model 25 is most easily calculated using a CAD system. However, it is conceivable that the volume could be calculated using other methods.

Figure 15A:
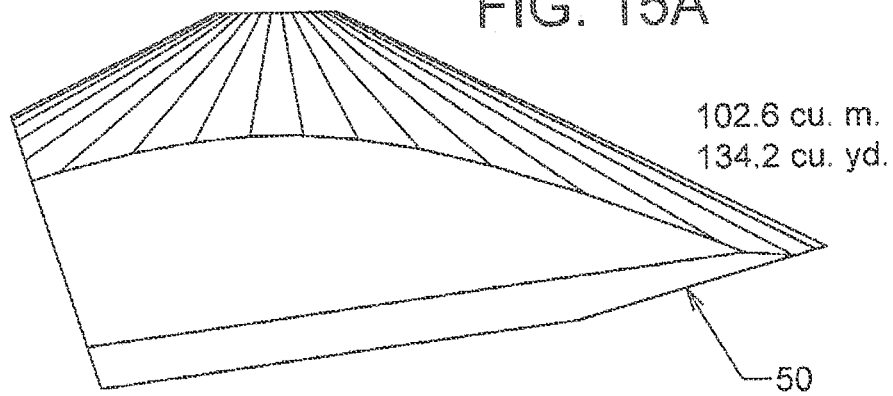
FIGS. 15 a, b, and c are comparison diagrams showing the difference between the truck body volumetric capacity rating as calculated in accordance with the present invention (FIG. 15a) and the rating based on a true 2:1 heap (FIG. 15b) and the SAE volumetric capacity rating (FIG. 15c).
Figure 15B:
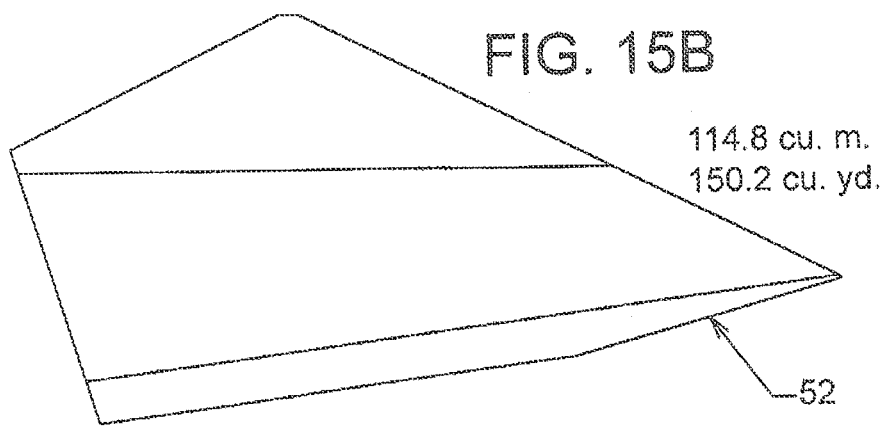
Figure 15C:
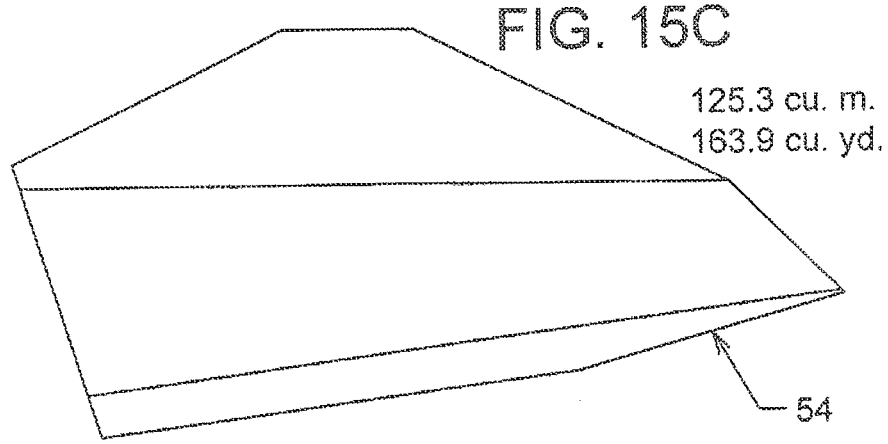

An example of the significant difference between the effective volumetric capacity rating as calculated using the method of the present invention and the capacity rating calculated using conventional methods is illustrated in FIGS. 15a-c. In particular, three dimensionally identically sized truck bodies are illustrated in FIGS. 15a-c. The effective volumetric capacity of the first truck body 50 (FIG. 15a) has been rated using the method of the present invention. The volumetric capacity of the second truck body 52 (FIG. 15b) has been rated based on a load model using only a 2:1 heap (i.e., where the 2:1 slope is maintained from the floor edge at the rear of the body) and flat planes. Finally, the volumetric capacity of the third truck body 54 (FIG. 15c) has been rated based on the method set forth in the SAE standard. As can be seen from FIG. 15, the volumetric capacity rating produced using the present invention (FIG. 15a) is approximately 18% less that the rating produced using the SAE standard (FIG. 15e) and approximately 11% less than the rating produced using a true 2:1 heap (FIG. 15b).

In order to maximize the volumetric load carrying capacity of a truck body 12, the height of the side walls 18 and the length of the body 12 must also be properly matched. This becomes evident when the method of the present invention is used to rate the volumetric carrying capacity of a truck body 12 which has been modified with sideboards 56 or a tail extension 58. For example, FIG. 16 illustrates a completed generic load model 25 that has been produced using the method of the present invention for a truck body 12 having sideboards 56. The sideboards 56 increase the height of the side walls 18 of the body 12, however, they can not be fully utilized because the volumetric capacity of the body 12 is limited by the length of the floor 22 which has been kept constant. In particular, when performing steps 2-4 (FIGS. 3-10) of the present invention, the height HS (FIG. 6) of the front-to-rear plateau profile line 36 (which takes into account the length of the floor) is lower than the height HE (FIG. 4) of the side-to-side plateau profile line 28 (which takes into account the height of the side walls 18 plus the sideboards 56). Thus, the side-to-side plateau profile line 28 (FIG. 4) must be lowered to correspond to the height HS of the front-to-rear plateau profile line 36 (FIG. 6), thereby limiting the effectiveness of the sideboards 56 with regard to increasing the volumetric carrying capacity of the truck body 12.

The opposite is true if the truck body 12 is lengthened, such as by using a tail extension 58, while the side walls 18 are kept at the same height such as shown in FIG. 17. Specifically, in such a case the height of the side walls 18 limits the volumetric carrying capacity of the truck body 12 because the height HE of the side-to-side plateau profile line 28 is lower than the height HS of the front-to-rear plateau profile line 36. This fact can be compensated some by lengthening the length of the final load plateau 38, however the typical problem with lengthening the final load plateau is that the center of gravity of the load model 25 is shifted rearward which may create an out of balance condition relative to the truck that is carrying the truck body and in lengthening the rear of the truck body the ground clearance of the truck body when dumped may be below the minimum required by statutory guidelines. Typical statutory regulations require that when dumped the rear lower corner of the truck body be no lower than the centerline of the axle of the truck on which the dump body is mounted. Otherwise, the height of the load plateau line has to be lowered in the front-to-rear profile thereby limiting the extra volumetric carrying capacity and limiting the length of the tail extension 58.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Of course, variations of those preferred embodiments will become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for estimating the volumetric capacity of an off-highway truck body design having a pair of side walls, a front wall and a floor, comprising the steps of:
   determining at least one material angle of repose of a heaped load to be carried by the truck body;
   establishing a three-dimensional model of the heaped load having a substantially conical upper surface that is based on the at least one material angle of repose and that intersects portions of the side walls, front wall and floor of the truck body design; and
   calculating a volume of the three-dimensional model of the heaped load.

2. The method of claim 1 wherein the shape of the load is different for differently shaped truck body designs but the upper conical surface of the heaped load is similar.

3. The method of claim 1 wherein the establishing the three-dimensional model of the heaped load includes determining a height of a top load plateau profile of the three-dimensional model based on dimensions of the truck body design.

4. The method of claim 1, wherein the material angle of repose is determined by observing loads carried by truck bodies in the field.

5. The method of claim 1, wherein the truck body design has an open rear end.

6. The method of claim 1, wherein the truck body design includes an open top.

7. A method for estimating the volumetric capacity of an off-highway truck body design comprising the steps of:
   determining a material angle of repose of a heaped load to be carried by the truck body;
   establishing a three-dimensional model of the heaped load using computer aided design, the three-dimensional model being based on the material angle of repose; and
   calculating a volume of the three-dimensional model of the heaped load.

8. The method of claim 7 wherein the shape of the load is different for differently shaped truck body designs but the upper conical surface of the heaped load is similar.

9. The method of claim 7 wherein the establishing the three-dimensional model of the heaped load includes determining a height of a top load plateau profile of the three-dimensional model based on dimensions of the truck body design.

10. The method of claim 7, wherein the material angle of repose is determined by observing loads carried by truck bodies in the field.

11. The method of claim 7, wherein the truck body design has an open rear end.

12. The method of claim 7, wherein the truck body design includes an open top.

13. The method of claim 7, wherein the three-dimensional model is based on more than one material angle of repose.

* * * * *